(12) United States Patent
Stuetzle et al.

(10) Patent No.: US 7,910,900 B2
(45) Date of Patent: Mar. 22, 2011

(54) COLLECTOR FOR AN ILLUMINATION SYSTEM

(75) Inventors: Ralf Stuetzle, Aalen (DE); Udo Dinger, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 913 days.

(21) Appl. No.: 11/781,010

(22) Filed: Jul. 20, 2007

(65) Prior Publication Data

US 2008/0018876 A1    Jan. 24, 2008

Related U.S. Application Data

(60) Provisional application No. 60/807,844, filed on Jul. 20, 2006.

(30) Foreign Application Priority Data

Jul. 20, 2006   (DE) .................. 10 2006 034 059
Jan. 23, 2007   (DE) .................. 10 2007 004 237

(51) Int. Cl.
*A61N 5/06*        (2006.01)

(52) U.S. Cl. ............... 250/504 R; 250/493.1; 250/503.1
(58) Field of Classification Search .................. None
See application file for complete search history.

(56) References Cited

U.S. PATENT DOCUMENTS

| | | | |
|---|---|---|---|
| 7,015,489 B2 | 3/2006 | Singer et al. | |
| 2004/0065817 A1 | 4/2004 | Singer et al. | |
| 2005/0094764 A1* | 5/2005 | Weiss | 378/34 |
| 2005/0195506 A1 | 9/2005 | McGuire | |

FOREIGN PATENT DOCUMENTS

| | | |
|---|---|---|
| DE | 101 38 313 | 7/2002 |
| EP | 1225481 | 7/2002 |
| EP | 1389747 | 2/2004 |

* cited by examiner

*Primary Examiner* — Bernard E Souw
*Assistant Examiner* — Andrew Smyth
(74) *Attorney, Agent, or Firm* — Fish & Richardson P.C.

(57) ABSTRACT

Collectors with mirror shells arranged inside each other, illumination systems equipped with such collectors, projection exposure apparatuses equipped with such illumination systems, methods of manufacturing microelectronic components with such projection exposure apparatuses, and related systems, components and methods are disclosed.

43 Claims, 16 Drawing Sheets

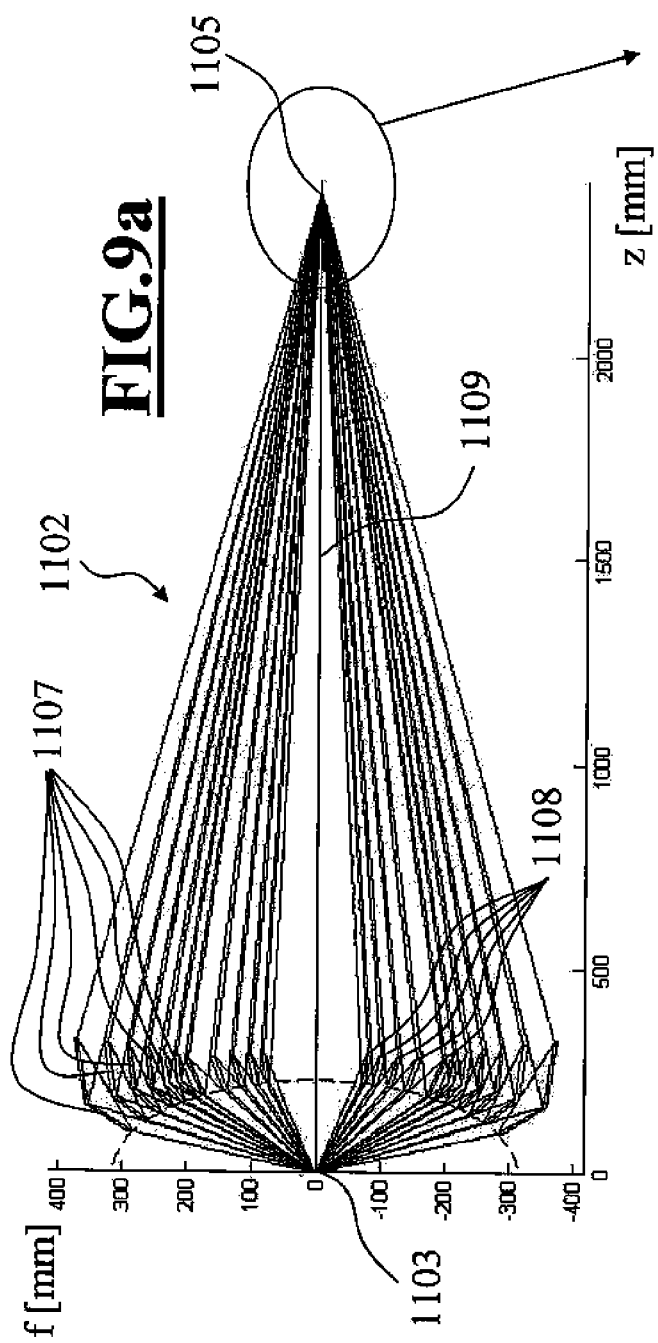
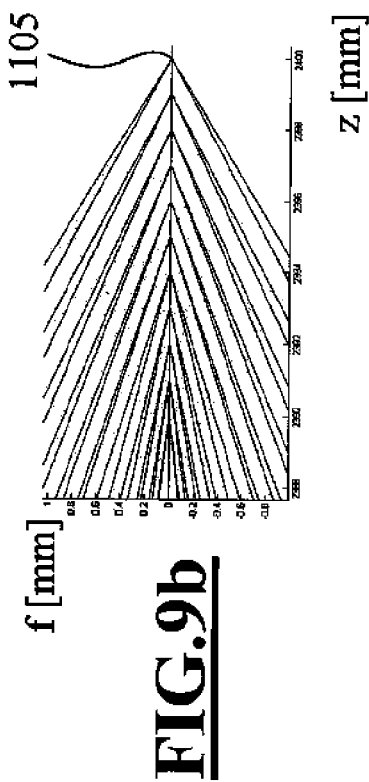
FIG.9a
FIG.9b

COLLECTOR FOR AN ILLUMINATION SYSTEM

CROSS-REFERENCE TO RELATED APPLICATIONS

This application claims priority under 35 U.S.C. §119(e)(1) to U.S. Provisional Patent Application Ser. No. 60/807,844, filed Jul. 20, 2006. This application also claims priority under 35 U.S.C. §119 to German Patent Application Serial No. 10 2006 034 059.0, filed Jul. 20, 2006, and German Patent Application Serial No. 10 2007 004 237.1, filed Jan. 23, 2007.

FIELD

The disclosure relates to collectors with mirror shells arranged inside each other, illumination systems equipped with such collectors, projection exposure apparatuses equipped with such illumination systems, methods of manufacturing microelectronic components with such projection exposure apparatuses, and related systems, components and methods.

BACKGROUND

Collectors equipped with mirror shells that are arranged inside each other for illumination systems of microlithography projection exposure apparatuses are known.

SUMMARY

In some embodiments, the present disclosure can provide systems, components and/or methods that advance the development of collectors (e.g., nested collectors) for high light transmission and taking the boundary conditions into consideration that are imposed by the manufacturing process, and/or that reduce (e.g., avoiding) the contamination of the mirror surfaces by dirt particles emitted by the light source, in particular for collectors with numerical aperture values greater than 0.8 on the side of the light source.

In one aspect, the disclosure features a collector that includes at least two mirror shells arranged inside each other around a collector axis. The collector is configured to be used in an illumination system of a microlithography projection exposure apparatus. The collector is also configured so that, during use, a light source side of the collector can collect light from a light source. A maximum thickness of at least one of the least two mirror shells is greater than 0.5 mm, and the ratio of an effective solid angle of the collector on the light source side to the subtended solid angle of the collector on the light source side is greater than 0.8. The ratio of the effective solid angle of the collector on the light source side to the subtended solid angle of the collector on the light source side is greater than R, where R=0.96−0.04/mm*D, and D is a maximum thickness of the at least two mirror shells measured in mm.

In another aspect, the disclosure features a collector that includes at least three mirror shells arranged inside each other around a collector axis. The collector is configured to be used in an illumination system of a microlithography projection exposure apparatus. The collector is also configured so that, during use, a light source side of the collector can collect light from a light source. Each of the mirror shells extends between a first axial distance and a second axial distance. The axial distances are defined along the collector axis originating from the light source. At least two mirror shells have first axial distances of unequal magnitude. For any two neighboring mirror shells, an outer of the two neighboring mirror shells has a shorter or equally large first axial distance and a shorter second axial distance in comparison to an inner of the two neighboring mirror shells.

In a further aspect, the disclosure features a collector that includes at least two mirror shells arranged inside each other around a collector axis, and a light source. The collector is configured to be used in an illumination system of a microlithography projection exposure apparatus. The collector is also configured so that, during use, a light source side of the collector can collect light from the light source. Each mirror shell has a distance from the light source. The distances of all of the mirror shells lie on an ellipsoid around the light source within a variation of +/−10%. Half axes of the ellipsoid are greater than 150 mm and smaller than 350 mm. The ellipsoid has at least two unequal half axes with a difference between the half axes of more than 5% relative to the smallest of the half axes.

In an additional aspect, the disclosure features an illumination system that includes a collector. The illumination system is configured to be used with wavelengths in the EUV range, and the collector is configured so that, during use, the collector can illuminate a plane. The collector includes at least two mirror shells arranged inside each other around a collector axis. The collector is configured so that, during use, a light source side of the collector can collect light from a light source. A maximum thickness of at least one of the least two mirror shells is greater than 0.5 mm, and the ratio of an effective solid angle of the collector on the light source side to the subtended solid angle of the collector on the light source side is greater than 0.8. The ratio of the effective solid angle of the collector on the light source side to the subtended solid angle of the collector on the light source side is greater than R, where R=0.96−0.04/mm*D, and D is a maximum thickness of the at least two mirror shells measured in mm.

In one aspect, the disclosure features an illumination system that includes a collector. The illumination system is configured to be used with wavelengths in the EUV range, and the collector is configured so that, during use, the collector can illuminate a plane. The collector includes at least three mirror shells arranged inside each other around a collector axis. The collector is configured so that, during use, a light source side of the collector can collect light from a light source. Each of the mirror shells extends between a first axial distance and a second axial distance. The axial distances are defined along the collector axis originating from the light source. At least two mirror shells have first axial distances of unequal magnitude. For any two neighboring mirror shells, an outer of the two neighboring mirror shells has a shorter or equally large first axial distance and a shorter second axial distance in comparison to an inner of the two neighboring mirror shells.

In another aspect, the disclosure features an illumination system that includes a collector. The illumination system is configured to be used with wavelengths in the EUV range, and the collector is configured so that, during use, the collector can illuminate a plane. The collector includes at least two mirror shells arranged inside each other around a collector axis, and a light source. The collector is configured so that, during use, a light source side of the collector can collect light from the light source. Each mirror shell has a distance from the light source. The distances of all of the mirror shells lie on an ellipsoid around the light source within a variation of +/−10%. Half axes of the ellipsoid are greater than 150 mm and smaller than 350 mm. The ellipsoid has at least two unequal half axes with a difference between the half axes of more than 5% relative to the smallest of the half axes.

In a further aspect, the disclosure features a projection exposure apparatus that includes an illumination system and a projection objective. The illumination system is configured so that, during use, the illumination system can illuminate a mask. The projection objective is configured so that, during use, the projection objective can produce an image of the mask on a light sensitive substrate. The illumination system includes a collector. The illumination system is configured to be used with wavelengths in the EUV range, and the collector is configured so that, during use, the collector can illuminate a plane. The collector includes at least two mirror shells arranged inside each other around a collector axis. The collector is configured so that, during use, a light source side of the collector can collect light from a light source. A maximum thickness of at least one of the least two mirror shells is greater than 0.5 mm, and the ratio of an effective solid angle of the collector on the light source side to the subtended solid angle of the collector on the light source side is greater than 0.8. The ratio of the effective solid angle of the collector on the light source side to the subtended solid angle of the collector on the light source side is greater than R, where R=0.96−0.04/mm*D, and D is a maximum thickness of the at least two mirror shells measured in mm.

In one aspect, the disclosure features a method of manufacturing microelectronic components using the projection exposure apparatus described in the preceding paragraph.

In an additional aspect, the disclosure features a projection exposure apparatus that includes an illumination system and a projection objective. The illumination system is configured so that, during use, the illumination system can illuminate a mask. The projection objective is configured so that, during use, the projection objective can produce an image of the mask on a light sensitive substrate. The illumination system includes a collector. The illumination system is configured to be used with wavelengths in the EUV range, and the collector is configured so that, during use, the collector can illuminate a plane. The collector includes at least three mirror shells arranged inside each other around a collector axis. The collector is configured so that, during use, a light source side of the collector can collect light from a light source. Each of the mirror shells extends between a first axial distance and a second axial distance. The axial distances are defined along the collector axis originating from the light source. At least two mirror shells have first axial distances of unequal magnitude. For any two neighboring mirror shells, an outer of the two neighboring mirror shells has a shorter or equally large first axial distance and a shorter second axial distance in comparison to an inner of the two neighboring mirror shells.

In another aspect, the disclosure features a method of manufacturing microelectronic components using the projection exposure apparatus described in the preceding paragraph.

In one aspect, the disclosure features a projection exposure apparatus that includes an illumination system and a projection objective. The illumination system is configured so that, during use, the illumination system can illuminate a mask. The projection objective is configured so that, during use, the projection objective can produce an image of the mask on a light sensitive substrate. The illumination system includes a collector. The illumination system is configured to be used with wavelengths in the EUV range, and the collector is configured so that, during use, the collector can illuminate a plane. The collector includes at least two mirror shells arranged inside each other around a collector axis, and a light source. The collector is configured so that, during use, a light source side of the collector can collect light from the light source. Each mirror shell has a distance from the light source. The distances of all of the mirror shells lie on an ellipsoid around the light source within a variation of +/−10%. Half axes of the ellipsoid are greater than 150 mm and smaller than 350 mm. The ellipsoid has at least two unequal half axes with a difference between the half axes of more than 5% relative to the smallest of the half axes.

In another aspect, the disclosure features a method of manufacturing microelectronic components using the projection exposure apparatus described in the preceding paragraph.

Embodiments can include one or more of the following features.

In some embodiments, a collector can have at least two mirror shells which are arranged inside each other around a collector axis and collect the bundle of light rays coming from a light source and transform it into a bundle of parallel or convergent light rays. The mirror shells in this arrangement can extend between a first axial distance and a second axial distance that is greater than the first axial distance. The mirror shells can be described in reference to a cylindrical coordinate system with the cylindrical coordinates represented by the axial distance z, the radial distance f, and the angle Φ. The origin of the cylindrical coordinate system lies at the location of the light source, and the z-axis is oriented in the direction of the collector axis. The axial distances z of each of the mirror shells have values ranging between the respective first and second axial distances for each mirror shell.

In some instances, EUV light sources can generate dirt particles, so-called debris, causing contamination of the mirror surfaces. Accordingly, it can be advantageous if the mirror shells have a minimum distance from the light source, for example to allow a debris-removing device to be installed between the light source and the collector. On the other hand, it can be advantageous to bring every individual mirror shell as close as possible to the light source in order to limit the maximum diameter of the mirror shells and thus of the collector. In order to achieve on the one hand a minimum distance and on the other hand to bring the mirror shells close to the light source, it can advantageous if the first axial distances of inner mirror shells are greater than the first axial distances of outer mirror shells. In some embodiments, the outer of the two mirror shells can have a smaller or at least equal first axial distance. This can make it possible for example to arrange the ends of the mirror shells closest to the light source at nearly equal distances around the light source. While for the outer mirror shells the first axial distances can increase markedly towards outer shells in order to maintain the distance of the outer mirror shells from the light source, for inner shells it is also possible to keep the first axial distance constant, which can allow the distance of the inner mirror shells from the light source to be maintained at least approximately.

In some embodiments, the mirror shells can be set up in such a way that, except for unavoidable losses due to the finite thickness of the mirror shells, the bundle of light rays emitted by the light source can be directed through the collector without geometrical losses. The individual collector shells can subdivide the aperture of the radiation emitted by the light source into ring-shaped apertures (e.g., of the kind shown in FIG. 2 of US 2004/0065817, which is hereby in corporated by reference). The light rays associated with a ring aperture illuminate individual ring elements in a plane after the collector, as illustrated in FIG. 3 of US 2004/0065817. If the first axial distances of the mirror shells decrease from one mirror shell to the next in sequential order from inner mirror shells towards outer mirror shells, this can have the consequence particularly in the case of source-side numerical apertures exceeding 0.8 that gaps will form between the ring elements in the plane to be illuminated, unless the second axial distances are adjusted in accordance with the disclosure.

In certain embodiments, a reference by which to measure a collector design that is optimized in regard to minimizing the geometrical losses is the ratio of the effective solid angle of the collector on the side of the light source to the subtended solid angle of the collector on the side of the light source, which ratio is dependent on the thicknesses of the mirror shells. The term effective solid angle on the side of the light source in this context means the solid angle on the side of the light source which is obtained as the sum of the source-side solid angles of the individual ring apertures that are transmitted by the collector. The term subtended solid angle on the side of the light source in the present context means the solid angle on the side of the light source which spans over the entire solid angle range from the smallest to the largest ring aperture on the side of the light source. The greater the ratio is between the effective solid angle of the collector on the side of the light source to the subtended solid angle of the collector on the side of the light source, the smaller are the geometrical losses of the collector.

One possibility to reduce the effect of the geometrical light losses and the formation of gaps between the ring apertures in a collector which contains only mirror shells with an equal number of mirror segments consists of an arrangement where the second axial distances of inner mirror shells are greater than the second axial distances of outer mirror shells, and where in particular for two neighboring mirror shells the outer of the two mirror shells has a smaller second axial distance than the inner of the two mirror shells.

Another possibility exists for a collector which in addition to neighboring mirror shells with an equal number of mirror segments also contains inner mirror shells with a lesser number of mirror segments and these inner mirror shells have a maximum receiving angle smaller than 37° on the source side, corresponding to a numerical aperture of 0.6, in which case the effect of the geometrical light losses and the formation of gaps can be reduced by an arrangement where for any two neighboring mirror shells with an equal number of mirror elements the outer of the two mirror shells has a smaller second axial distance than the inner of the two mirror shells.

A further possibility to reduce the effect of the geometrical light losses and the formation of gaps for a collector which in addition to neighboring mirror shells with an equal number of mirror segments also contains inner mirror shells with a lesser number of mirror segments and these inner mirror shells have on the source side a maximum receiving angle greater than or equal to 37°, corresponding to a numerical aperture of 0.6, consists of an arrangement where for any two neighboring mirror shells with an equal number of mirror elements the outer of the two mirror shells has a greater second axial distance than the inner of the two mirror shells.

Since the ratio defined above depends on the thicknesses of the individual shells, there is also the possibility to minimize the shell thickness in order to minimize the effect of gap formation and of the geometrical transmission loss. However concerns for stability impose limits on this approach with a maximum thickness of a mirror shell of roughly 0.5 mm. The thickness of a mirror shell is measured in the surface-normal direction of the mirror shell.

Another possibility for suppressing the effect of the geometrical light losses and the gap formation, besides reducing the shell thickness overall, consists of reducing the shell thickness at the ends of the mirror shells that face away from the light source. A significant effect from this can already be noticed if the thickness of one of the mirror shells at the side that faces away from the light source is smaller than the maximum thickness of the mirror shell by more than 10% of the maximum thickness of the mirror shell.

There is also the possibility to reduce or close only the gaps between the ring apertures in the far field of the collector without thereby changing the geometrical transmission loss, by using an arrangement where the individual mirror shells are focused on different second foci along the collector axis. A noticeable effect in the reduction of the gaps between the ring apertures already occurs if for at least two mirror shells the second foci have different distances from the respective first focus on the source side along the collector axis, with the difference between the distances being greater than 0.01% of the distance of one of the second foci of the at least two mirror shells from the respective first focus on the source side.

Based on the individual possibilities named above or a combination of the possibilities, it is possible to realize a ratio greater than 0.8 between the effective solid angle on the source side of the collector and the subtended solid angle on the source side of the collector. This means that from a purely geometrical point of view, these collectors are capable of transporting to the output side of the collector more than 80% of the light of the light source that is radiated by the light source into the solid angle range subtended by the collector.

Based on the individual possibilities named above or a combination of the possibilities, a ratio greater than 0.9 between the effective solid angle on the source side of the collector to the subtended solid angle on the source side of the collector can further be realized by using thin mirror shells, in particular mirror shells in which at least one of the mirror shells has a maximum thickness of at most 3.5 mm.

In general based on the individual possibilities named above or a combination of the possibilities, a ratio of the effective solid angle on the source side of the collector to the subtended solid angle on the source side of the collector greater than 0.8 and in addition greater than an number R can be realized in dependency of the maximum thickness D of the mirrors shells measured in mm according to the following equation $R=0.96-0.04/mm*D$. This equation represents the Transmission-Thickness-Relation of collectors.

It should however be noted that because of concerns about the stability of the collector shells as mentioned above, a maximum thickness greater than 0.5 mm should be maintained in at least one of the mirror shells of the collector.

In light sources which radiate the light nearly with rotational symmetry about the collector axis, as is mostly the case for pinch plasma sources or laser plasma sources for the EUV range of wavelengths, it is advantageous if the mirror shells of the collector that is adapted to this light source are arranged with rotational symmetry about the collector axis. For technical reasons related to the manufacturing process, it is likewise advantageous if the mirror shells are arranged with rotational symmetry about the collector axis.

In order to achieve a high transmission, the light rays can fall on the mirror shells at shallow angles (grazing incidence), so that the angles of incidence in reference to the mirror surfaces are smaller than 30°.

Large source-side numerical aperture values can lead to large angles of incidence on the outer mirror shells and thus to large transmission losses at the reflection. As a way of reducing the angles of incidence, it is advantages if the mirror shells consist of at least two mirror segments arranged so that one follows the other in the direction of the light.

In the last-mentioned arrangement, the mirror segment closest to the light source has the shape of a segment of a hyperboloid in one of whose foci the light source is arranged. In this case, a virtual image of the light source is formed in the second focus of the hyperboloid, with a further image of the virtual image being produced by way of the mirror segment following the source-side mirror segment.

If the further mirror segment has the shape of a section of an ellipsoid, the virtual image of the light source is located in one of the foci of the ellipsoid while the other focus is located at the position of a real intermediate image of the light source. The sequence of a hyperboloid followed by an ellipsoid leads to the result that the imaging ratio for an individual mirror shell is nearly constant, so that the ring element associated with a mirror shell is covered with a nearly homogeneous illumination.

If the further mirror segment has the shape of a paraboloid section, the virtual image of the light source produced by the hyperboloid is located in the focus of the paraboloid, while the other focus is located at infinity, so that the light bundle entering the collector is transformed into a parallel light bundle.

For a mirror shell of a collector where the mirror shell consists of three mirror segments with the order of sequence being hyperboloid—hyperboloid—ellipsoid or hyperboloid—hyperboloid—paraboloid, the statements made regarding the location of the foci for a mirror shell with two mirror segments can be analogously applicable.

The mirror segments of a mirror shell which are arranged so that one follows the other can be arranged with or without a separating distance between them.

The arrangement without a separation has the advantage that the mirror segments can be integrated on a common carrier substrate, in particular in a monolithic configuration with the carrier substrate.

The arrangement with a separating distance makes it possible to separately adjust the mirror segments of a mirror shell.

In order to realize a point-to-point image, for example to project an image source into an intermediate focus, the surface shape for a mirror shell that suggests itself is a segment of an ellipsoid.

With the boundary conditions that the maximum diameter of the collector is limited, that the surfaces of the mirror shells need to have an exclusively positive slope in order to be manufacturable by replication, and that the angles of incidence should not become too large, it is advantageous to use ellipsoid-shaped mirror shells besides the aforementioned mirror shells that consist of at least two mirror segments.

Under the last-mentioned concept, it is advantageous if the ellipsoid-shaped mirror shells are arranged to the inside of the mirror shells that consist of two mirror segments. One achieves thereby that in the outer mirror shells transmission losses due to high angles of incidence are avoided, while ensuring on the other hand for the inner shells that the mirror surfaces have exclusively positive slopes.

In order to bring the mirror shells on the one hand as close as possible to the light source and on the other hand to provide space to accommodate devices serving to prevent the contamination of the mirror surfaces, it can be advantageous if the source-side ends of the mirror surfaces are located on an imaginary sphere with a radius $r_{debris}$ within a variation range of 10% of the radius.

The direct distances of the individual mirror shells from the light source are thus nearly equal to each other. The term direct distance means the shortest distance between the light source and a surface point on the mirror shell.

The direct distances of the mirror shells from the light source can be at least 150 mm, to allow the installation of devices that serve to prevent the contamination of the mirror surfaces.

However, the direct distances of the mirror shells from the light source can also be smaller than 350 mm. Otherwise, the diameter of the collector can become too large.

If the source-facing ends of the mirror surfaces lie on an imaginary sphere with the radius $r_{debris}$, it can be advantageous not to let the opposite-facing ends of the mirror shells terminate at a plane that runs perpendicular to the collector axis. It has been found that it is advantageous for a collector which is composed exclusively of mirror shells with an equal number of mirror segments, if the radial distances f of the ends or the mirror shells that face away from the light source conform to the following equation describing their dependency on the respective axial distance z from the light source:

$$f'(z') = \frac{p_1 \cdot z' + p_2}{z' + q_1} \cdot (1 \pm 0.1),$$

wherein $p_1=0.2294$, $p_2=-0.2081$, and $q_1=-1.9273$.

The radial distances f' and the axial distances z' in the foregoing equation represent the normalized distances f and z relative to the radius $r_{debris}$. The radius $r_{debris}$ represents the minimal direct distance of the mirror shells from the light source.

In some embodiments of collectors the source-side ends of the mirror shells are located on an imaginary ellipsoid with unequal half axes that are between 150 mm and 350 mm long, wherein the difference between the half axes is greater than 5% of the shortest half axis. If not all ends of the mirror shells lie directly on an ellipsoid, one takes for a reference surface an ellipsoid which represents a best fit between the ends of the mirror shells based on a least-square approximation. The source-side ends of the mirror shells should now lie on this ellipsoid as a reference surface with a variation of up to 10% in their distances from the light source. The ellipsoid can have the advantage in comparison to a sphere that the ellipsoid makes it possible to bring the inner shells closer to the light source.

To ensure a uniform illumination after the collector, it can be advantageous if the collector has between 5 and 15 mirror shells. For numerical apertures on the source side up to 0.9 it can be advantageous if the collector has between 5 and 12 mirror shells (e.g., between 8 and 12 mirror shells). For numerical apertures on the source side above 0.9 it can be advantageous if the collector has between 9 and 15 mirror shells.

The features of the collector according to the foregoing description can be brought to bear in a case where the collector has a source-side numerical aperture greater than or equal to 0.8 (e.g., greater than or equal to 0.85, greater than or equal to 0.9).

If the source side of the collector is not surrounded by an immersion medium, it can be advantageous if the source-side numerical aperture is smaller than 1.0. By meeting this criterion, one can achieve that no optical components are present in the source plane perpendicular to the collector axis.

If the collector projects an image of the light source into an intermediate focus, it can be advantageous if the input-side numerical aperture of more than 0.8 is reduced by the collector to an output-side numerical aperture between 0.15 and 0.3. As a result of this measure, the angles of incidence of the rays on the optical elements that follow the collector will generally be small. Small angles of incidence can mean low reflection losses and thus a high transmission.

In a nested collector with mirror shells arranged in rotational symmetry relative to the collector axis it can be difficult to avoid a central obscuration occurs in the output-side illumination.

This is due to light rays which miss the innermost mirror shell. These light rays are in many cases shut out by an obscuration device. In particular if the surfaces of the mirror shells are to have only positive slopes, the size of the central obscuration cannot be arbitrarily made smaller, especially if the source-side numerical aperture is large. However, the design concept according to the disclosure can make it possible that the ratio of the diameter of the obscuration relative to the diameter of the light bundle at the location of the obscuration is at most 1:4 (e.g., at most 1:5).

In order to ensure that the mirror shells can be manufactured by replication, it can be advantageous if in all mirror shells the radial distance of the mirror surface to the collector axis remains constant or increases with increasing axial distance from the light source.

Furthermore, in consideration of spatial constraints, the maximum diameter of the collector can be kept within limits. It can be advantageous if the maximum radial distance of all mirror shells from the collector axis is between 1.2 times and 3 times as large as the direct distance of the innermost mirror shell from the light source.

Furthermore, the axial dimension of the collector can be limited. A reference for this axial dimension is the distance between the two foci that are projected images of each other in the ray path geometry of the collector. The distance between the two foci can be in the range from 7 to times the direct distance of the innermost mirror shell from the focus on the source side.

Collectors of this kind find application in particular for illumination systems in the field of microlithography. For lithography processes in the EUV range of wavelengths, only reflective optical elements are generally used. While optical elements with a nearly perpendicular incidence of the light can have a maximum transmission of about 70% for wavelengths in the range of 13 nm, higher transmissivities can be achieved with optical elements with a grazing incidence of the light. Since the light transmission of an illumination system for microlithography projection exposure apparatus is generally directly correlated to the throughput in the production of semiconductor components, collectors with nested mirror shells and thus with a high light transmission are advantageously suited for this application, especially if they also have the capability to accept very high numerical apertures, in excess of 0.8, on the source side. The scope of the disclosure therefore also includes illumination systems with collectors of this kind. In addition to the collector according to the disclosure, these illumination systems include elements for the homogeneous illumination of a field and for influencing the pupil illumination.

Illumination systems of this kind are used for example in lithography projection exposure apparatus. In a lithography projection exposure apparatus, an illumination system illuminates a structure-carrying mask (reticle), an image of which is projected by the projection objective onto a light-sensitive substrate.

Lithography projection exposure apparatus of this kind have been disclosed for example in US 2004/0065817.

Microstructured semiconductor elements are manufactured in a multitude of individual highly complex process steps. A step in the process concerns the photographic exposure of light-sensitive substrates (wafers), for example silicon substrates coated with a photoresist lacquer. For producing an individual circuit layer, an image of the particular reticle is projected by the projection objective onto the wafer.

BRIEF DESCRIPTION OF THE DRAWINGS

In the following, further details of the disclosure will be explained more specifically with references to the embodiments which are illustrated in the drawings, wherein
FIG. 9a represents a lens section of a collector;
FIG. 9b represents a detail of FIG. 9a in the area of the intermediate focus;
FIG. 10 represents a detail of FIG. 9a.

DETAILED DESCRIPTION

Figure 1:
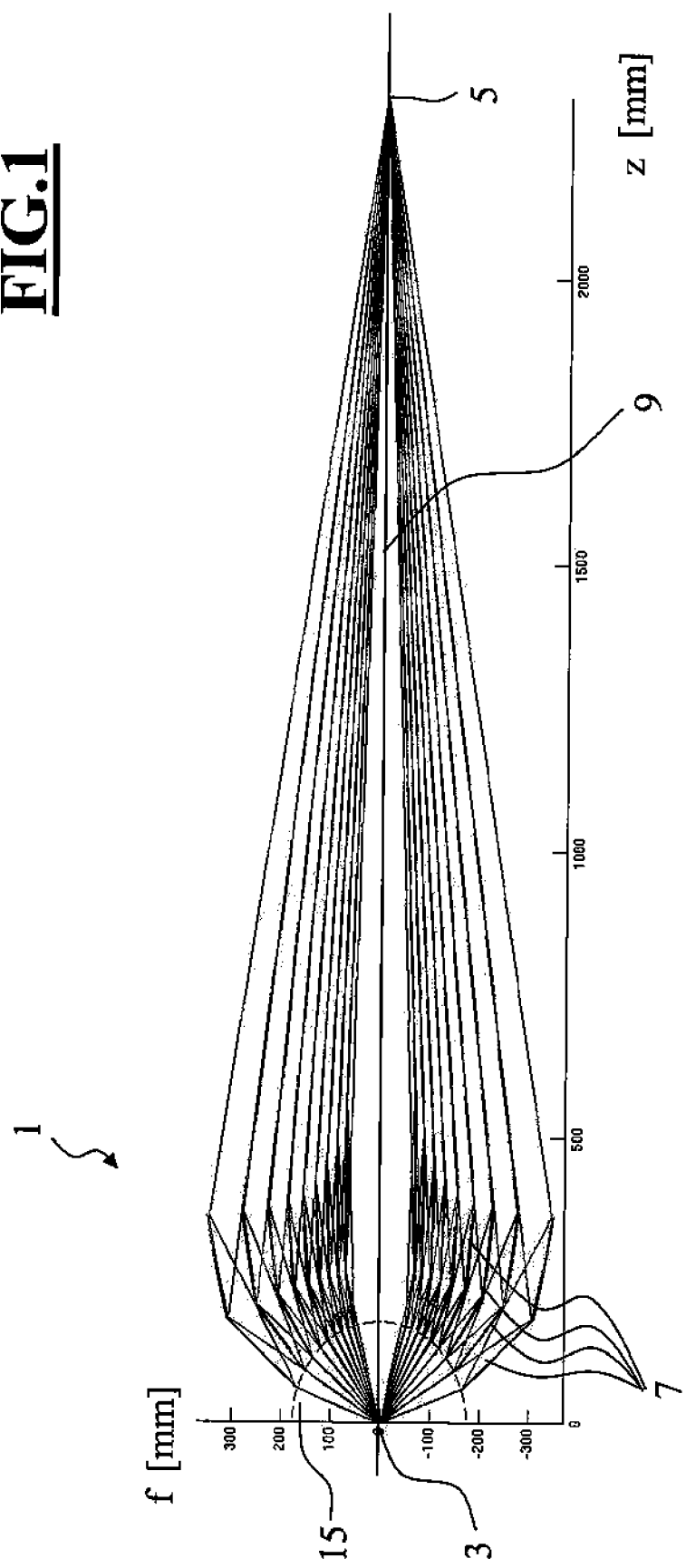
FIG. 1 represents a lens section of a collector.
Figure 2:
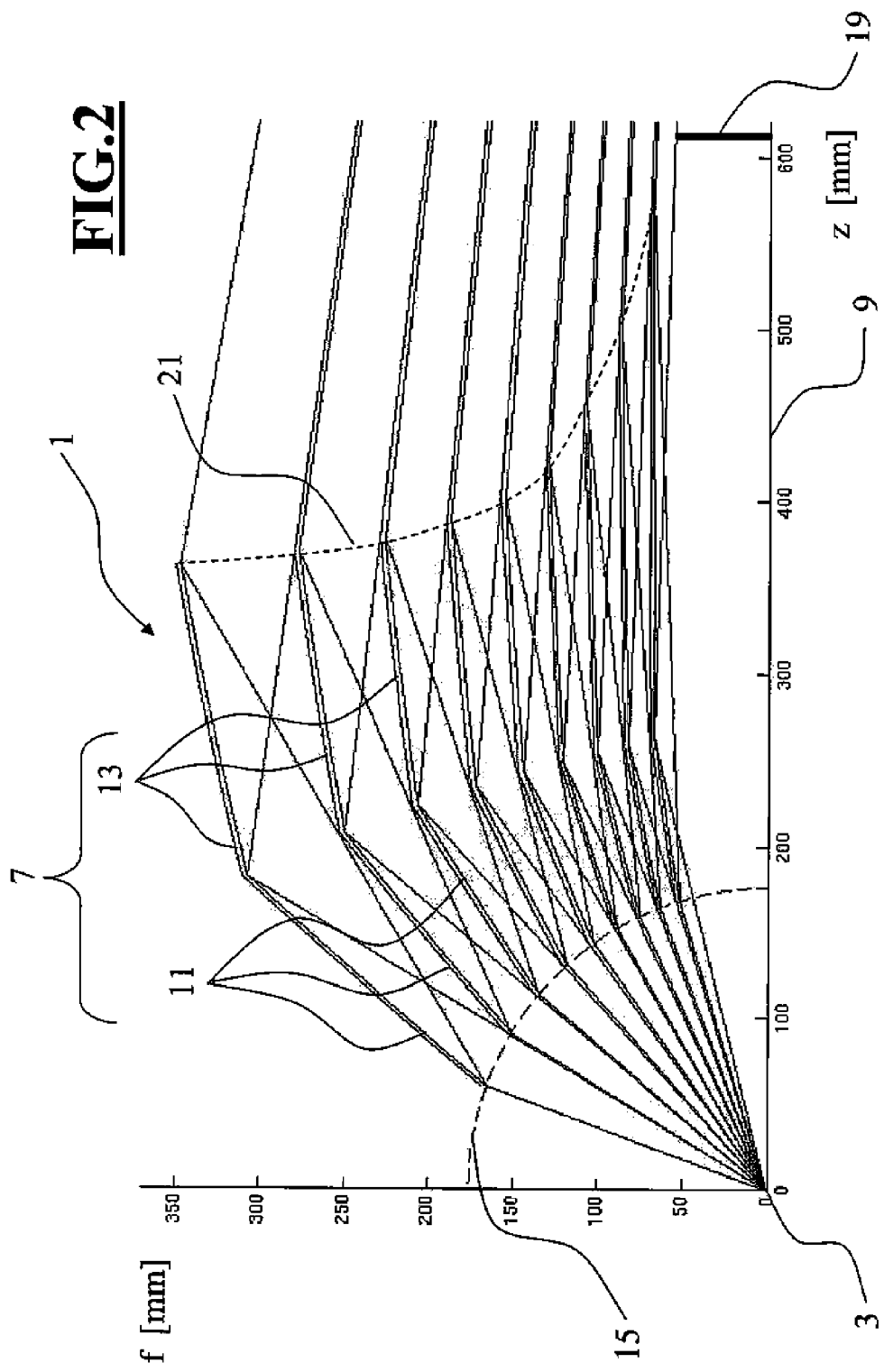
FIG. 2 represents a detail of FIG. 1.

FIG. 1 shows a lens section of the collector 1. FIG. 2 shows a detail of FIG. 1, with the same reference symbols being used for corresponding elements in FIGS. 1 and 2. The collector 1 projects an image of the light source 3, for example a plasma light source for the emission of EUV radiation, onto the intermediate focus 5. The collector 1 consists of nine mirror shells 7 which are arranged with rotational symmetry around the collector axis 9. Each of the mirror shells 7 consists of two mirror segments 11 and 13 which are arranged so that they follow each other in the direction of the light. The mirror segments 11 in this arrangement have the shape of a section of a hyperboloid, while the mirror segments 13 have the shape of a section of an ellipsoid.

TABLE 1

| shell | $r_h$ [mm] | $k_h$ | $zO_h$ [mm] | $r_e$ [mm] | $k_e$ | $zO_e$ [mm] |
|---|---|---|---|---|---|---|
| 1 | 87.1 | −2.193 | −35.1 | 123.5 | −0.907 | −279.6 |
| 2 | 59.6 | −1.631 | −26.2 | 78.3 | −0.941 | −280.9 |
| 3 | 42.7 | −1.369 | −19.7 | 51.0 | −0.961 | −296.2 |
| 4 | 31.2 | −1.225 | −14.6 | 33.6 | −0.975 | −323.6 |
| 5 | 23.0 | −1.139 | −11.1 | 22.0 | −0.984 | −364.7 |
| 6 | 17.3 | −1.085 | −8.5 | 14.2 | −0.990 | −432.3 |
| 7 | 12.9 | −1.049 | −6.4 | 8.8 | −0.994 | −540.5 |
| 8 | 9.5 | −1.026 | −4.7 | 5.1 | −0.997 | −732.6 |
| 9 | 6.8 | −1.012 | −3.4 | 2.7 | −0.998 | −1151.5 |

Table 1 contains the optical data for the collector 1 according to FIG. 1. Shell 1 is the outermost shell, and shell 9 is the innermost shell. The surfaces of the mirror segments are described by the following formula:

$$z_{h/e}(f) = \frac{\frac{f^2}{r_{h/e}}}{1 + \sqrt{1 - (k_{h/e} + 1)\left(\frac{f}{r_{h/e}}\right)^2}} + zO_{h/e} \qquad (1)$$

In this equation, z represents the axial distance of a surface point relative to the origin of the cylindrical coordinate system which lies at the location of the light source 3, and f represents the radial distance of the same surface point in reference to the collector axis 9. The hyperboloids and ellipsoids are defined by the parameters $r_{h/e}$ and $k_{h/e}$. The symbol $zO_{h/e}$ stands for the axial distance of the surface vertices of the hyperboloids and ellipsoids from the light source 3.

TABLE 2

| shell | z1 [mm] | f1 [mm] | z2 [mm] | f2 [mm] | z3 [mm] | f3 [mm] |
|---|---|---|---|---|---|---|
| 1 | 60.1 | 165.5 | 182.4 | 307.1 | 363.1 | 347.0 |
| 2 | 91.2 | 150.6 | 207.5 | 249.6 | 370.2 | 277.1 |
| 3 | 114.0 | 134.2 | 223.6 | 206.4 | 378.1 | 226.4 |
| 4 | 130.9 | 117.8 | 234.9 | 172.2 | 388.4 | 187.2 |
| 5 | 143.5 | 102.1 | 243.4 | 143.9 | 402.3 | 155.3 |
| 6 | 152.5 | 88.1 | 249.4 | 120.7 | 423.0 | 129.4 |
| 7 | 159.3 | 75.1 | 254.4 | 100.5 | 453.1 | 106.8 |
| 8 | 164.5 | 63.0 | 258.6 | 82.6 | 499.3 | 86.6 |
| 9 | 168.3 | 51.8 | 262.2 | 66.7 | 576.9 | 67.8 |

The mirror segments only represent sections of the hyperboloids and ellipsoids that define their surfaces. Table 2 shows the axial distances z1 and z2 between which the mirror segments 11 to the source side extend in the form of a hyperboloid section, and the axial distances z2 and z3 between which the mirror segments 13 on the output side extend in the form of an ellipsoid section. The individual mirror shells 7 thus extend between the axial distances z1 and z3. The hyperboloid mirror segments and the ellipsoid mirror segments thus follow each other in seamless transition.

The radial distances of the individual mirror segments 11 and 13 from the collector axis 9 at the beginning and end of each mirror segment 11 and 13 are represented by the symbols f1, f2 and f3.

As can be seen in Table 2, progressing from the inside towards the outside, the respective axial distances z1 of the source-facing ends of the mirror shells 7 become smaller.

The source-facing ends of the mirror shells 7 lie on a virtual spherical surface 15 with a radius $r_{debris}$=176 mm. The clearance between the mirror shells 7 and the light source 3 which is defined by this sphere provides the space to install a device for removing the debris produced by the light source 3.

The ring aperture elements received on the source side by the individual mirror shells 7 adjoin each other almost contiguously, meaning that the aperture on the source side has no gaps between the individual ring aperture elements except for interruptions that are due to the finite thickness of the mirror shells 7. The positions for the ends of the mirror shells 7 that face away from the light source 3 are defined in such a way that the ring elements associated with the respective mirror shells, which illuminate a plane which in the light direction follows the collector 1, adjoin each other to a large extent continuously, meaning that the output-side aperture of the collector has likewise no gaps between the individual output-side ring aperture elements except for interruptions that are due to the finite thickness of the mirror shells 7.

Furthermore, the positions of the ends of the mirror shells 7 farthest from the light source 3 are defined in such a way that the ratio of the effective solid angle on the source side and the subtended angle on the source side of the collector is greater than 0.8.

As can be seen in Table 2, in the progression from the inside to the outside, the axial distances z3 of the output-side ends of the mirror shells become smaller.

The ends of the mirror shells 7 that face away from the source lie on a virtual surface 21 whose intersection with the meridional plane can be described approximately by the following equation:

$$f'(z) = \frac{p_1 \cdot z' + p_2}{z' + q_1} \quad (2)$$

wherein $p_1$=0.2294, $p_2$=−0.2081, and $q_1$=−1.9273.

The radial distances f' and the axial distances z' are normalized in relation to the distance $r_{debris}$=176 mm of the individual collector shells from the light source 3.

The collector 1 has a numerical aperture of 0.94 on the side of the source, which corresponds to a collection angle of +/−70°. The numerical aperture on the output side is 0.175.

The collector 1 includes an obscuration device 19 serving to block those rays which are not reflected at the innermost mirror shell 7. As a result of this, a numerical aperture of 0.0324 is obscured on the output side. The ratio of the obscured numerical aperture in relation to the maximum size of the numerical aperture on the output side is thus 1:5.4.

The maximum distance of the outermost mirror shell 7 from the collector axis 9 is 347 mm, which is twice the distance $r_{debris}$=176 mm of the innermost collector shell from the light source 3.

The distance of the light source 3 from the intermediate focus 5 is 2315.4 mm, which equals 13 times the distance $r_{debris}$=176 mm of the innermost collector shell from the light source 3.

Mirror shells 7 with a diameter greater than 300 mm have a uniform thickness of 3 mm. Mirror shells 7 with a diameter of less than 300 mm have a uniform thickness of 2 mm.

The individual mirror shells 7 are coated with ruthenium, palladium, rhodium, niobium, molybdenum or gold.

The ratio of the effective solid angle on the source side to the subtended angle on the source side of the collector 1 is 0.92.

The number R of the Transmission-Thickness-Relation is 0.84 for the collector 1.

Figure 3:
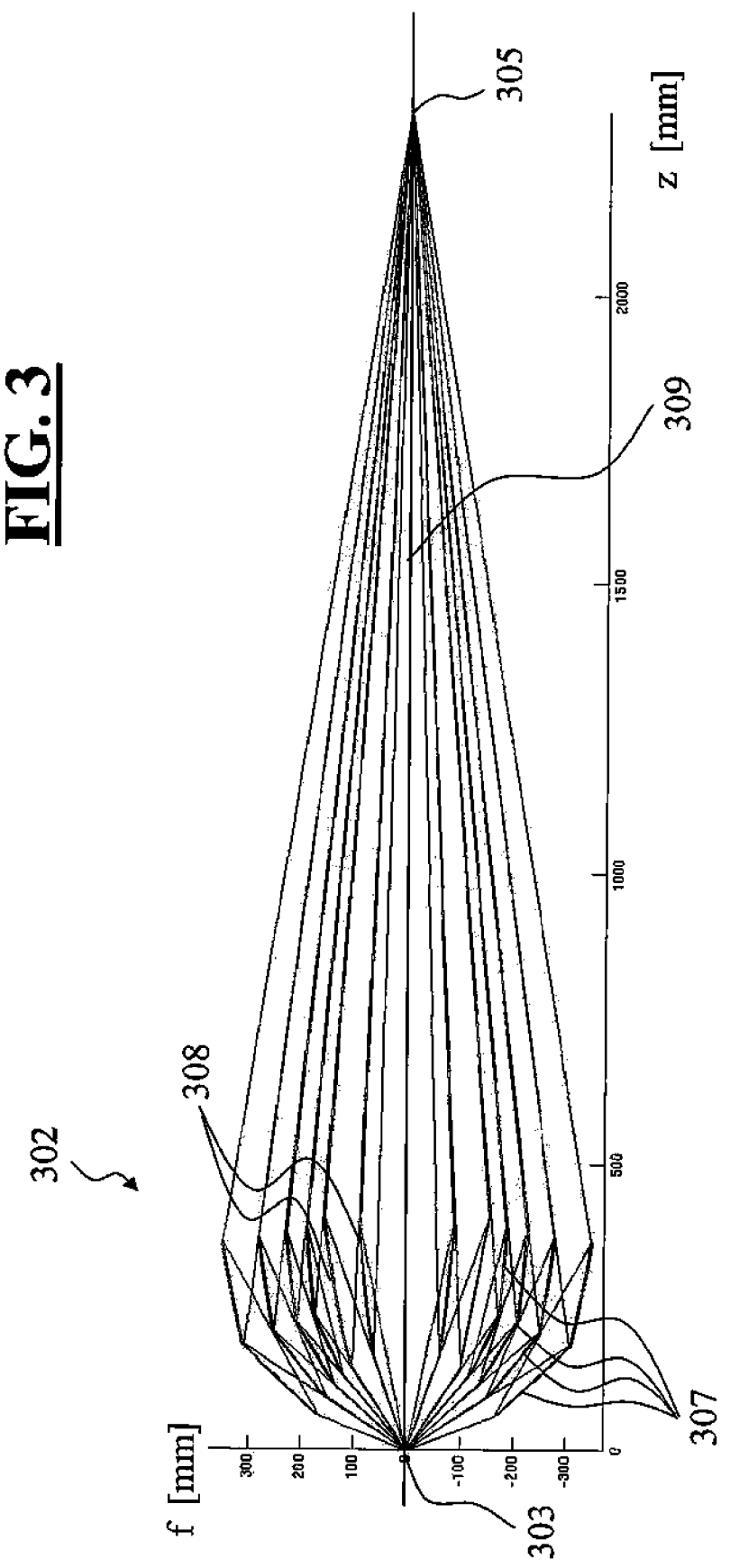
FIG. 3 represents a lens section of a collector.
Figure 4:
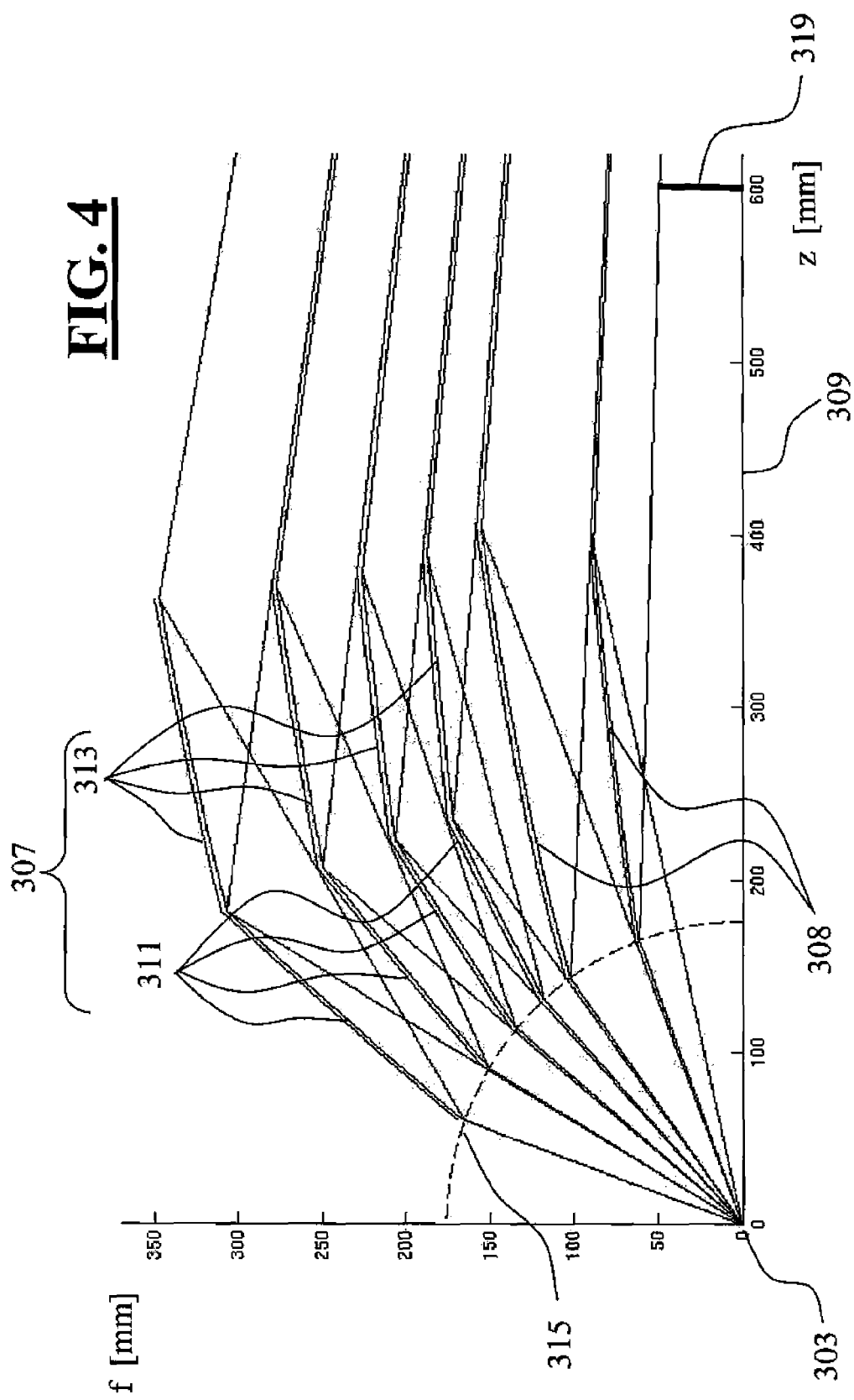
FIG. 4 represents a detail of FIG. 3.

FIG. 3 shows a lens section to illustrate a collector 302. FIG. 4 shows a detail of FIG. 3, with the same reference symbols being used for corresponding elements in FIGS. 3 and 4. The elements in FIGS. 3 and 4 which are analogous to those in FIGS. 1 and 2 have the same reference symbols as the latter but raised by 300. For a description of these elements, the reader is referred to the description of FIGS. 1 and 2.

The collector 302 projects an image of the light source 303 into the intermediate focus 305. The collector 302 consists of six mirror shells 307, 308 which are arranged with rotational symmetry about the collector axis 309. The collector 302 according to FIG. 3 has four mirror shells 307, each of which consists of two mirror segments 311 and 313 with different types of surfaces, which are arranged so that they follow each other in the direction of light propagation, while the two inner mirror shells 308 are shaped like the section of an ellipsoid and thus have only one type of surface. The mirror segments 311 in this arrangement are shaped like a section of a hyperboloid, while the mirror segments 313 are shaped like a section of an ellipsoid.

TABLE 3

| shell | $r_h$ [mm] | $k_h$ | $zO_h$ [mm] | $r_e$ [mm] | $k_e$ | $zO_e$ [mm] |
|---|---|---|---|---|---|---|
| 1 | 87.1 | −2.193 | −35.1 | 123.5 | −0.907 | −279.6 |
| 2 | 59.6 | −1.631 | −26.2 | 78.3 | −0.941 | −280.9 |
| 3 | 42.7 | −1.369 | −19.7 | 51.0 | −0.961 | −296.2 |
| 4 | 31.2 | −1.225 | −14.8 | 33.6 | −0.975 | −323.6 |
| 5 | | | | 34.8 | −0.970 | −17.5 |
| 6 | | | | 11.9 | −0.990 | −6.0 |

Table 3 contains the optical data for the collector 302 of FIG. 3. Shell 1 is the outermost shell, and shell 6 is the innermost shell. The surfaces of the mirror segments are described by equation (1).

TABLE 4

| shell | z1 [mm] | f1 [mm] | z2 [mm] | f2 [mm] | z3 [mm] | f3 [mm] |
|---|---|---|---|---|---|---|
| 1 | 60.1 | 165.5 | 182.4 | 307.1 | 363.1 | 347.0 |
| 2 | 91.2 | 150.6 | 207.5 | 249.6 | 370.2 | 277.1 |
| 3 | 114.0 | 134.2 | 223.6 | 206.4 | 378.1 | 226.4 |
| 4 | 130.9 | 117.8 | 234.9 | 172.2 | 388.4 | 187.2 |
| 5 | 143.5 | 102.1 | | | 404.2 | 155.2 |
| 6 | 165.1 | 61.4 | | | 391.3 | 88.5 |

The mirror segments of the mirror shells 307 and the mirror shells 308 only represent sections of the hyperboloids and ellipsoids that define their surfaces. Table 4 lists for the mirror shells 307 the axial distances z1 and z2 between which the mirror segments 311 to the source side extend in the form of a hyperboloid section and the axial distances z2 and z3 between which the mirror segments 313 to the source side extend in the form of an ellipsoid section. The hyperboloid mirror segments and the ellipsoid mirror segments of the mirror segments 307 follow each other in seamless transition. Thus, the individual mirror shells 307 extend between the axial distances z1 and z3.

The mirror shells 308 which are shaped like a section of an ellipsoid extend between the axial distances z1 and z3.

The radial distances of the mirror shells 307 and 308, and of the individual mirror segments 311 and 313 from the collector axis 309 at the beginning and end of each mirror shell or each mirror segment are listed as f1, f2 and f3.

As can be seen in Table 4, progressing from the inside towards the outside, the respective axial distances z1 of the source-facing ends of the mirror shells 7 become smaller.

The source-facing ends of the mirror shells 307, 308 lie on a virtual spherical surface 315 with a radius $r_{debris}$=176 mm. The clearance space defined by this sphere provides the space to install a device for removing the debris produced by the light source 303.

The ring aperture elements received on the source side by the individual mirror shells adjoin each other almost contiguously, meaning that the aperture on the source side has no gaps between the individual ring aperture elements except for interruptions that are due to the finite thickness of the mirror shells 307 and 308. The positions for the ends of the mirror shells 307 and 308 that face away from the light source 303 are defined in such a way that the ring elements associated with the respective mirror shells, which illuminate a plane which in the light direction follows the collector 302, adjoin each other to a large extent continuously, meaning that the output-side aperture of the collector has likewise no gaps between the individual output-side ring aperture elements except for interruptions that are due to the finite thickness of the mirror shells 307 and 308. Furthermore, the positions of the ends of the mirror shells 307 farthest from the light source 303 are defined in such a way that the ratio of the effective solid angle on the source side and the subtended angle on the source side of the collector is greater than 0.8.

As can be seen in Table 4, progressing from the inside towards the outside, the respective axial distances z3 of the ends at the output side of the mirror shells 307 become smaller. The inner mirror shells 308 with a smaller number of mirror segments have a maximum receiving angle on the source side of 35.4° which corresponds to a numerical aperture of 0.58.

The collector 302 has a numerical aperture of 0.94 on the side of the source, which corresponds to a collection angle of +/−70°. The numerical aperture on the output side is 0.175.

The collector 302 includes an obscuration device 319 serving to block those rays which are not reflected at the innermost mirror shell. As a result of this, a numerical aperture of 0.0285 is obscured on the output side. The ratio of the obscured numerical aperture in relation to the size of the transmitted numerical aperture on the output side is thus 1:6.1.

The maximum distance of the outermost mirror shell 307 from the collector axis 309 is 347 mm, which is twice the distance $r_{debris}$=176 mm of the innermost collector shell from the light source 303.

The distance of the light source 303 from the intermediate focus 5 is 2315.4 mm, which equals 13 times the distance $r_{debris}$=176 mm of the innermost collector shell from the light source 303.

Mirror shells 307 with a diameter greater than 300 mm have a uniform thickness of 3 mm.

Mirrors shell 307 with a diameter of less than 300 mm have a uniform thickness of 2 mm.

The individual mirror shells 307 and 308 are coated with ruthenium, palladium, rhodium, niobium, molybdenum or gold.

The ratio of the effective solid angle on the source side and the subtended angle on the source side of the collector 302 is greater than 0.94.

The number R of the Transmission-Thickness-Relation is 0.84 for the collector 320.

Figure 5:
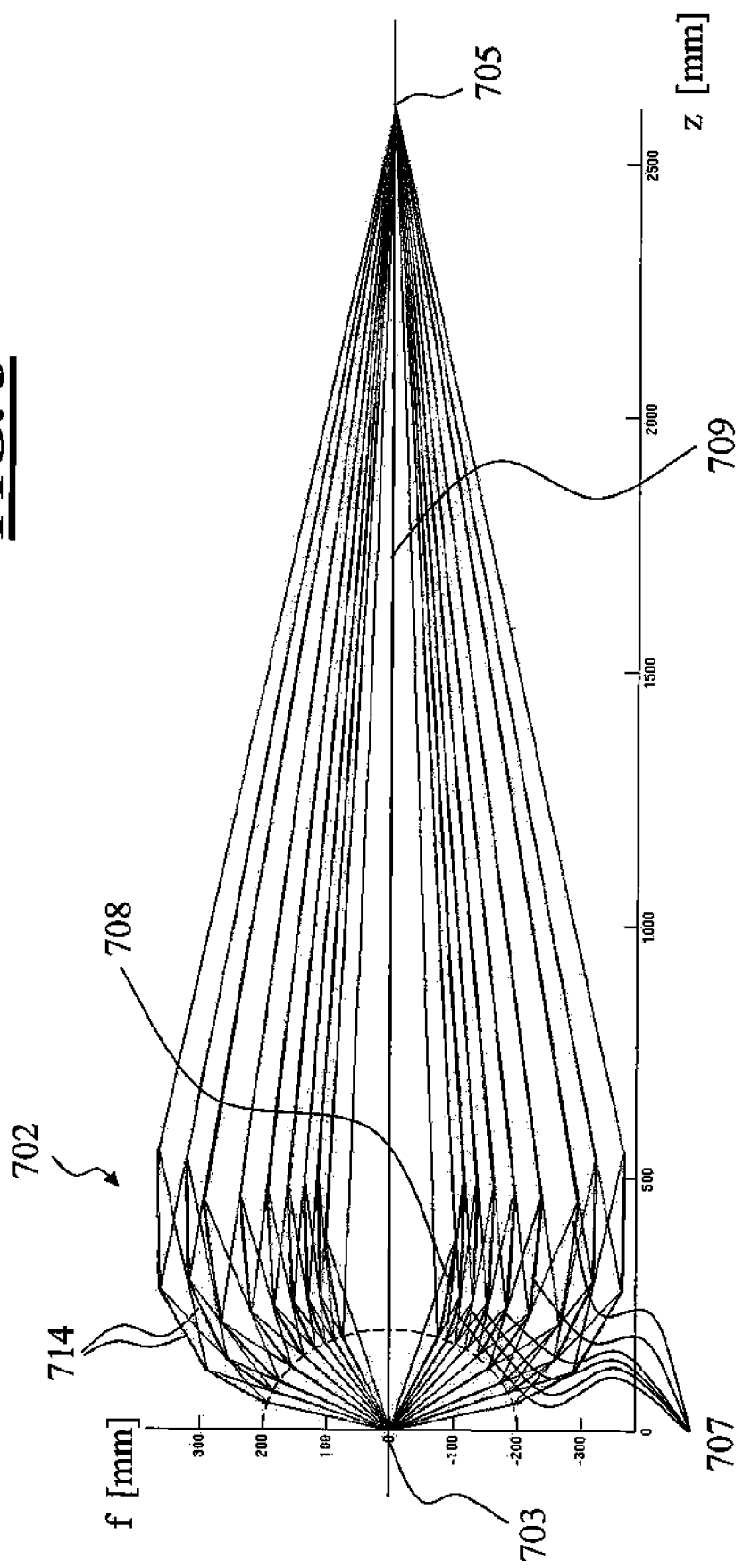
FIG. 5 represents a lens section of a collector.
Figure 6:
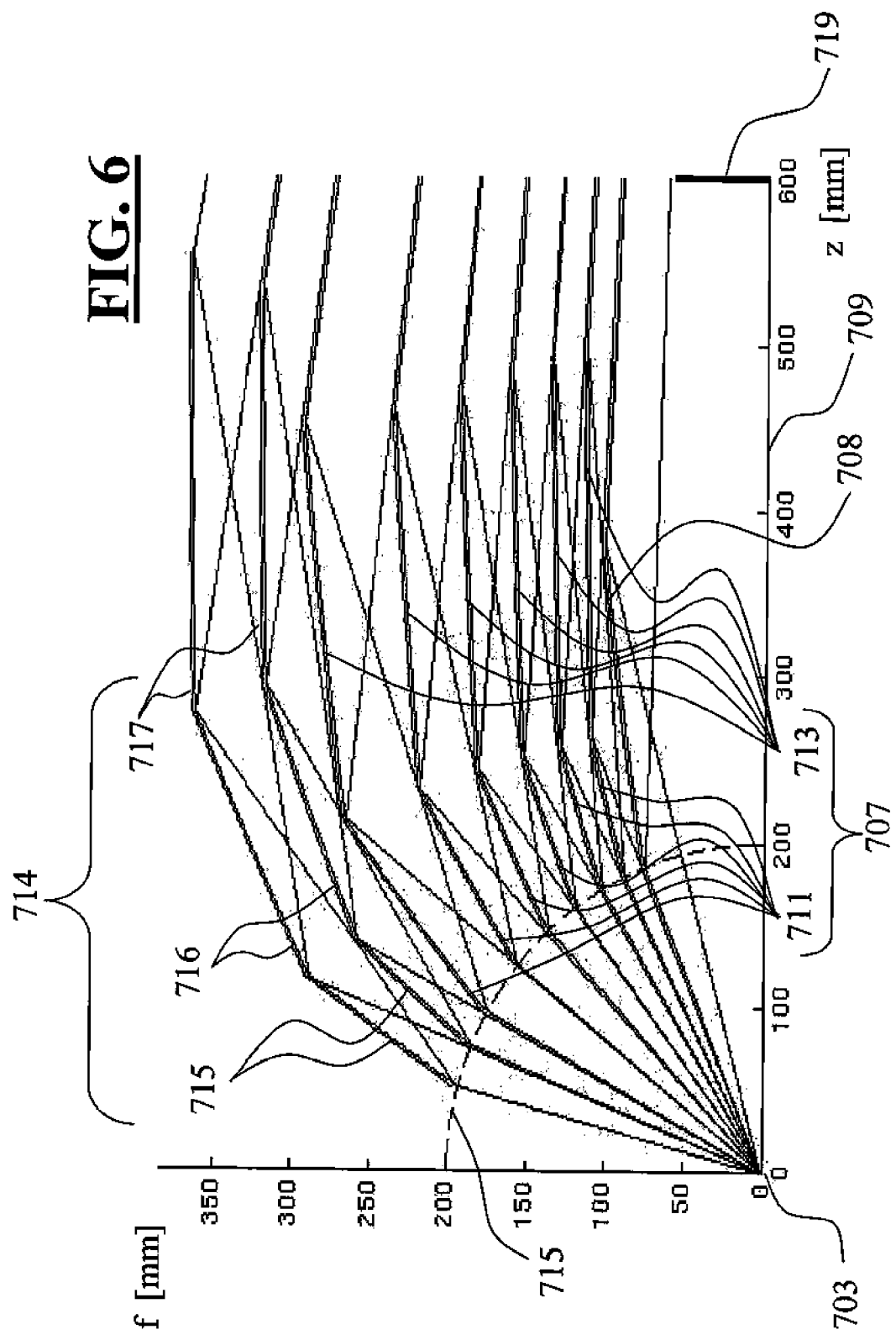
FIG. 6 represents a detail of FIG. 5.

FIG. 5 shows a lens section to illustrate a collector 702. FIG. 6 shows a detail of FIG. 5, with the same reference symbols being used for corresponding elements in FIGS. 5 and 6. The elements in FIGS. 5 and 6 which are analogous to those in FIGS. 3 and 4 have the same reference symbols as the latter but raised by 400. For a description of these elements, the reader is referred to the description of FIGS. 3 and 4.

The collector 702 projects an image of the light source 703 into the intermediate focus 705. The collector 702 consists of nine mirror shells 707, 708 and 714 which are arranged with rotational symmetry about the collector axis 709. The collector 702 according to FIG. 5 has two mirror shells 714, each of which consists of three mirror segments 715, 716 and 717 with different types of surfaces, which are arranged so that they follow each other in the direction of light propagation. The mirror segments 715 and 716 in this arrangement are shaped like a section of a hyperboloid, while the mirror segment 717 are shaped like a section of an ellipsoid. The collector 702 further has six mirror shells 707, each of which consists of two mirror segments 711 and 713 belonging to different surface types, while the inner mirror shell 708 is shaped like a section of an ellipsoid and thus includes only one surface type. The mirror segments 711 in this arrangement are shaped like a section of a hyperboloid, while the mirror segments 713 are shaped like a section of an ellipsoid.

TABLE 5

| shell | $r_{h1}$ [mm] | $k_{h1}$ | $zO_{h1}$ [mm] | $r_{h2}$ [mm] | $k_{h2}$ | $zO_{h2}$ [mm] | $r_e$ [mm] | $k_e$ | $zO_e$ [mm] |
|---|---|---|---|---|---|---|---|---|---|
| 1 | 112.8 | −2.839 | −42.0 | 86.7 | −1.144 | −248.5 | 64.0 | −0.969 | −1528.4 |
| 2 | 87.8 | −2.132 | −35.7 | 62.2 | −1.105 | −256.9 | 49.7 | −0.976 | −1493.2 |
| 3 | 82.2 | −1.469 | −37.2 | | | | 67.0 | −0.957 | −459.1 |
| 4 | 58.4 | −1.254 | −27.5 | | | | 40.8 | −0.974 | −534.9 |
| 5 | 42.5 | −1.148 | −20.5 | | | | 25.8 | −0.984 | −626.9 |
| 6 | 31.2 | −1.091 | −15.3 | | | | 16.8 | −0.990 | −726.6 |
| 7 | 23.0 | −1.058 | −11.3 | | | | 11.2 | −0.993 | −821.3 |
| 8 | 16.8 | −1.038 | −8.3 | | | | 7.7 | −0.996 | −894.6 |
| 9 | | | | | | | 15.7 | −0.988 | −7.9 |

Table 5 contains the optical data for the collector 702 of FIG. 5. Shell 1 is the outermost shell, and shell 9 is the innermost shell. The surfaces of the mirror segments are described by equation (1).

TABLE 6

| shell | z1 [mm] | f1 [mm] | z1' [mm] | f1' [mm] | z2 [mm] | f2 [mm] | z3 [mm] | f3 [mm] |
|---|---|---|---|---|---|---|---|---|
| 1 | 51.8 | 193.2 | 117.5 | 287.7 | 277.7 | 362.1 | 553.3 | 365.4 |
| 2 | 76.8 | 184.6 | 140.5 | 257.0 | 294.7 | 317.3 | 535.4 | 320.1 |
| 3 | 97.2 | 174.8 | | | 213.2 | 265.6 | 452.4 | 293.7 |
| 4 | 126.4 | 155.0 | | | 231.8 | 217.7 | 461.7 | 236.0 |
| 5 | 146.9 | 135.7 | | | 244.0 | 181.3 | 472.4 | 193.7 |
| 6 | 161.6 | 117.9 | | | 252.4 | 152.4 | 483.3 | 161.0 |
| 7 | 172.1 | 101.8 | | | 258.5 | 128.9 | 492.8 | 134.9 |
| 8 | 179.8 | 87.5 | | | 263.2 | 109.2 | 499.3 | 113.7 |
| 9 | 185.4 | 74.9 | | | | | 379.8 | 101.8 |

The mirror segments of the mirror shells 707, 714 and the mirror shell 708 only represent sections of the hyperboloids and ellipsoids that define their surfaces. Table 6 lists for the mirror shells 707 (shells 3-8 in Table 6, i.e. mirror shells 707 with mirror segments 711 and 713 according to FIG. 6) the axial distances z1 and z2 between which the mirror segments 711 to the source side extend in the form of a hyperboloid section and the axial distances z2 and z3 between which the mirror segments 713 on the output side extend in the form of an ellipsoid section. The hyperboloid mirror segments and the ellipsoid mirror segments of the mirror segments 707 follow each other in seamless transition. Thus, the individual mirror shells 707 extend between the axial distances z1 and z3. Accordingly, the individual mirror shells 707 extend between the axial distances z1 and z3. In analogous presentation, Table 6 shows for the mirror shells 714 (shells 1 and 2 in Table 6, i.e. mirror shells 714 with mirror segments 715, 716 and 717 in FIG. 6) the axial distances z1 and z1' between which the mirror segments 715 to the source side extend in the form of a hyperboloid section; the axial distances z1' and z2 between which the intermediate mirror segments 716 extend in the form of a hyperboloid section; and the axial distances z2 and z3 between which the mirror segments 717 to the output side extend in the form of an ellipsoid section. The two hyperboloid mirror segments and the ellipsoid mirror segments of each of the two mirror shells 714 follow each other in seamless transition. The individual mirror shells 714 thus extend between the axial distances z1 and z3.

The mirror shells 708 (shell 9 in Table 6, i.e. mirror shell 708 in FIG. 6) which are shaped like a section of an ellipsoid extend between the axial distances z1 and z3.

The radial distances of the mirror shells 707, 714 and 708, and of the individual mirror segments 711, 713, 715, 716, 717 from the collector axis 709 at the beginning and end of each mirror shell or each mirror segment are listed as f1, f1', f2 and f3.

As can be seen in Table 6, progressing from the inside towards the outside, the respective axial distances z1 of the source-facing ends of the mirror shells 707 and 714 become smaller.

The source-facing ends of the mirror shells 707, 708, 714 lie on a virtual spherical surface 715 with a radius $r_{debris}=200$ mm. The clearance space defined by this sphere provides the space to install a device for removing the debris produced by the light source 703.

The ring aperture elements received on the source side by the individual mirror shells adjoin each other almost contiguously, meaning that the aperture on the source side has no gaps between the individual ring aperture elements except for interruptions that are due to the finite thickness of the mirror shells 707, 714 and 708. The positions for the ends of the mirror shells 707, 714 and 708 that face away from the light source 703 are defined in such a way that the ring elements associated with the respective mirror shells, which illuminate a plane which in the light direction follows the collector 702, adjoin each other to a large extent continuously, meaning that the output-side aperture of the collector has likewise no gaps between the individual output-side ring aperture elements except for interruptions that are due to the finite thickness of the mirror shells 707, 714 and 708. Furthermore, the positions of the ends of the mirror shells 707 and 714 farthest from the light source 703 are defined in such a way that the ratio of the effective solid angle on the source side and the subtended angle on the source side of the collector is greater than 0.8.

As can be seen in Table 6, progressing from the inside towards the outside, the respective axial distances z3 of the ends at the output side of the mirror shells 707 become smaller. The inner mirror shell 708 with a smaller number of mirror segments has a maximum receiving angle on the source side of 22° which corresponds to a numerical aperture of 0.37.

As can further be seen in Table 6, progressing from the inside towards the outside, the respective axial distances z3 of the ends at the output side of the mirror shells 714 become greater. The inner mirror shells 707 with a smaller number of mirror segments have a maximum receiving angle on the source side of 60.9° which corresponds to a numerical aperture of 0.87.

The collector 702 has a numerical aperture of 0.97 on the side of the source, which corresponds to a collection angle of +/−75°. The numerical aperture on the output side is 0.175.

The collector 702 includes an obscuration device 719 serving to block those rays which are not reflected at the innermost mirror shell. As a result of this, a numerical aperture of 0.0309 is obscured on the output side. The ratio of the obscured numerical aperture in relation to the size of the transmitted numerical aperture on the output side is thus 1:5.7.

The maximum distance of the outermost mirror shell 714 from the collector axis 709 is 365.4 mm, which is almost twice the distance $r_{debris}$=200 mm of the innermost collector shell from the light source 703.

The distance of the light source 703 from the intermediate focus 705 is 2609.1 mm, which equals 13 times the distance $r_{debris}$=200 mm of the innermost collector shell from the light source 703.

All mirror shells of the collector 702 have the same uniform thickness of 2 mm. In general, the thickness of a collector shell can be between 1 mm and 5 mm. The thickness of a collector shell in certain embodiments can range from 5 mm to 10 mm.

The individual mirror shells 707, 714 and 708 are coated with ruthenium, palladium, rhodium, niobium, molybdenum or gold.

The ratio of the effective solid angle on the source side and the subtended angle on the source side of the collector 702 is 0.94.

The number R of the Transmission-Thickness-Relation is 0.88 for the collector 702.

Figure 7:
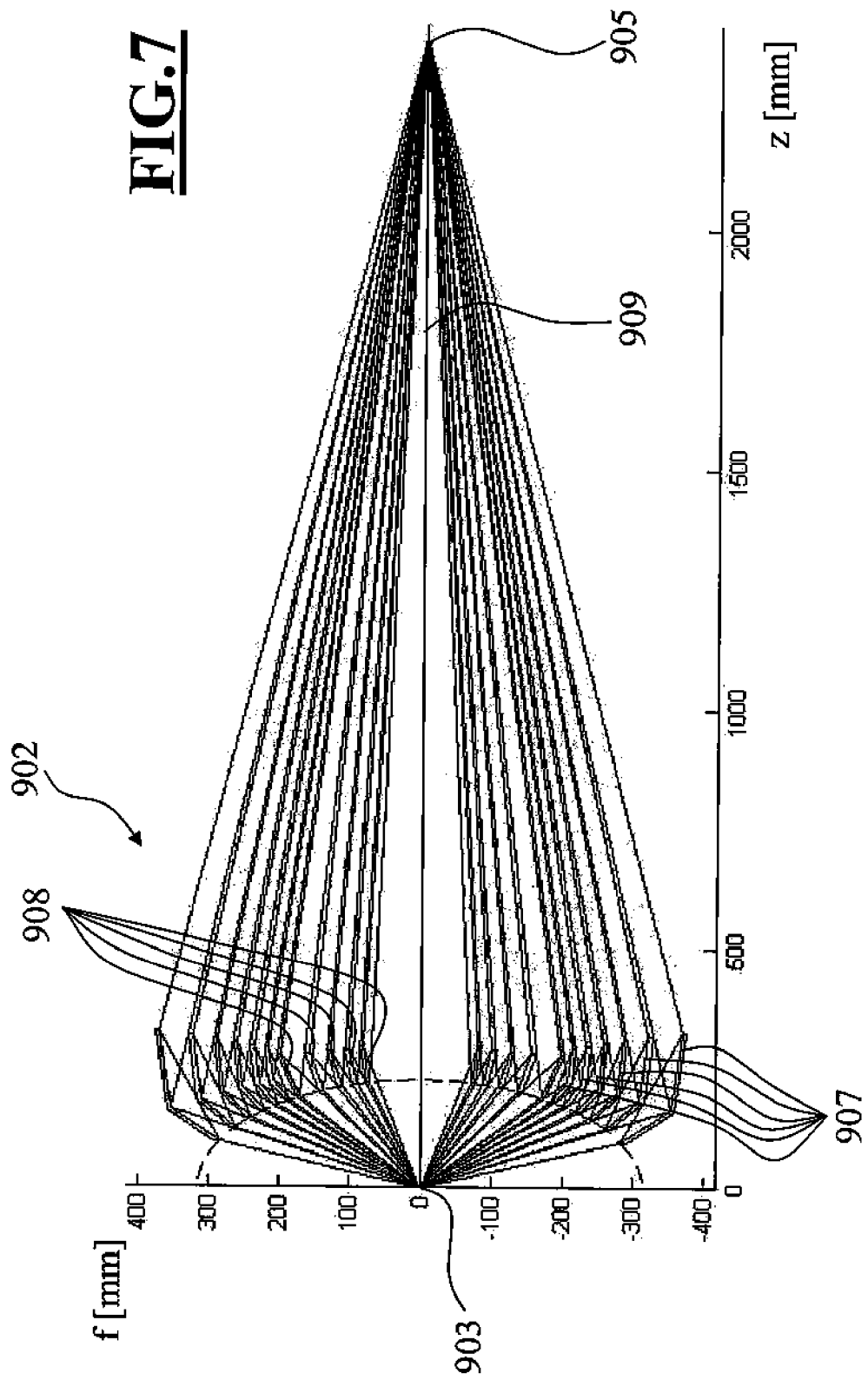
FIG. 7 represents a lens section of a collector.
Figure 8:
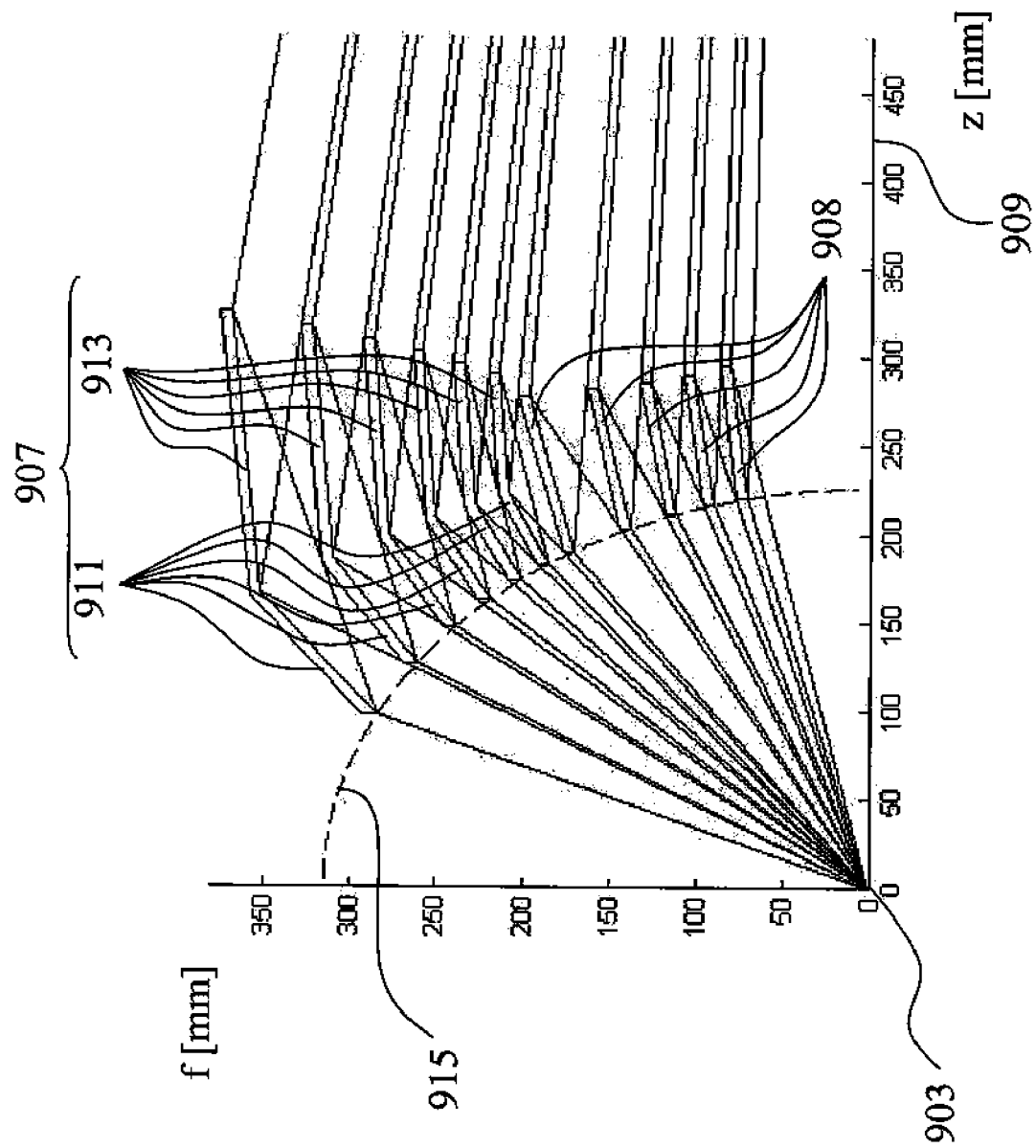
FIG. 8 represents a detail of FIG. 7.

FIG. 7 shows a lens section to illustrate a collector 902. FIG. 8 shows a detail of FIG. 7, with the same reference symbols being used for corresponding elements in FIGS. 7 and 8. The elements in FIGS. 7 and 8 which are analogous to those in FIGS. 1 and 2 have the same reference symbols as the latter but raised by 900. For a description of these elements, the reader is referred to the description of FIGS. 1 and 2.

The collector 902 projects an image of the light source 903 into the intermediate focus 905. The collector 902 consists of eleven mirror shells 907, 908 which are arranged with rotational symmetry about the collector axis 909. The collector 902 according to FIG. 7 has six mirror shells 907, each of which consists of two mirror segments 911 and 913 with different types of surfaces, which are arranged so that they follow each other in the direction of light propagation, while the five inner mirror shells 908 are shaped like a section of an ellipsoid and thus have only one type of surface. The mirror segments 911 in this arrangement are shaped like a section of a hyperboloid, while the mirror segments 913 are shaped like a section of an ellipsoid.

TABLE 7

| shell | $r_h$ [mm] | $k_h$ | $zO_h$ [mm] | $r_e$ [mm] | $k_e$ | $zO_e$ [mm] |
|---|---|---|---|---|---|---|
| 1 | 173.4 | −1.679 | −75.5 | 97.6 | −0.938 | −711.1 |
| 2 | 135.1 | −1.482 | −60.9 | 74.3 | −0.953 | −719.9 |
| 3 | 107.1 | −1.380 | −49.2 | 60.2 | −0.961 | −692.3 |
| 4 | 85.7 | −1.319 | −39.9 | 50.9 | −0.967 | −643.0 |
| 5 | 68.9 | −1.277 | −32.4 | 44.1 | −0.971 | −584.1 |
| 6 | 55.6 | −1.247 | −26.2 | 38.8 | −0.974 | −522.5 |
| 7 | | | | 70.6 | −0.943 | −35.8 |
| 8 | | | | 46.1 | −0.962 | −23.3 |
| 9 | | | | 30.2 | −0.975 | −15.2 |

TABLE 7-continued

| shell | $r_h$ [mm] | $k_h$ | $zO_h$ [mm] | $r_e$ [mm] | $k_e$ | $zO_e$ [mm] |
|---|---|---|---|---|---|---|
| 10 | | | | 19.5 | −0.984 | −9.8 |
| 11 | | | | 12.2 | −0.990 | −6.1 |

Table 7 contains the optical data for the collector 902 of FIG. 7. Shell 1 is the outermost shell, and shell 11 is the innermost shell. The surfaces of the mirror segments are described by equation (1).

TABLE 8

| shell | z1 [mm] | f1 [mm] | z2 [mm] | f2 [mm] | z3 [mm] | f3 [mm] |
|---|---|---|---|---|---|---|
| 1 | 97.7 | 283.7 | 166.5 | 351.8 | 325.4 | 368.7 |
| 2 | 126.9 | 260.3 | 185.9 | 309.9 | 318.3 | 321.8 |
| 3 | 147.5 | 238.4 | 199.5 | 277.1 | 310.5 | 286.4 |
| 4 | 162.6 | 218.6 | 209.7 | 250.3 | 303.3 | 258.0 |
| 5 | 174.2 | 200.7 | 217.6 | 227.6 | 297.0 | 234.3 |
| 6 | 183.2 | 184.6 | 224.0 | 208.0 | 291.8 | 213.8 |
| 7 | 190.2 | 170.3 | | | 277.9 | 196.6 |
| 8 | 203.4 | 137.7 | | | 282.3 | 157.0 |
| 9 | 211.6 | 111.5 | | | 286.4 | 126.4 |
| 10 | 216.9 | 89.6 | | | 290.6 | 101.4 |
| 11 | 220.4 | 70.9 | | | 295.5 | 80.4 |

The mirror segments of the mirror shells 907 and the mirror shells 908 only represent sections of the hyperboloids and ellipsoids that define their surfaces. Table 8 lists for the mirror shells 907 the axial distances z1 and z2 between which the mirror segments 911 to the source side extend in the form of a hyperboloid section and the axial distances z2 and z3 between which the mirror segments 913 on the output side extend in the form of an ellipsoid section. The hyperboloid mirror segments and the ellipsoid mirror segments of the mirror segments 907 follow each other in seamless transition. Thus, the individual mirror shells 907 extend between the axial distances z1 and z3.

The mirror shells 908 which are shaped like a section of an ellipsoid extend between the axial distances z1 and z3.

The radial distances of the mirror shells 907 and 908 and of the individual mirror segments 911 and 913 from the collector axis 909 at the beginning and end of each mirror shell or each mirror segment are listed as f1, f2 and f3.

As can be seen in Table 8, progressing from the inside towards the outside, the respective axial distances z1 of the source-facing ends of the mirror shells 907 become smaller.

The source-facing ends of the mirror shells 907, 908 lie on a virtual ellipsoid surface 915 with a short half axis of 226.25 mm and a long half axis of 314.47 mm. The clearance space defined by this ellipsoid provides the space to install a device for removing the debris produced by the light source 903.

The ring aperture elements received on the source side by the individual mirror shells adjoin each other almost contiguously, meaning that the aperture on the source side has no gaps between the individual ring aperture elements except for interruptions that are due to the finite thickness of the mirror shells 907 and 908. The positions for the ends of the mirror shells 907 and 908 that face away from the light source 903 are defined in such a way that the ring elements associated with the respective mirror shells, which illuminate a plane which in the light direction follows the collector 902, adjoin each other to a large extent continuously, meaning that the output-side aperture of the collector has likewise no gaps between the individual output-side ring aperture elements except for interruptions that are due to the finite thickness of the mirror shells 907 and 908. Furthermore, the positions of the ends of the mirror shells 907 farthest from the light source 903 are defined in such a way that the ratio of the effective solid angle on the source side and the subtended angle on the source side of the collector is greater than 0.8.

As can be seen in Table 8, progressing from the inside towards the outside, the respective axial distances z3 of the ends at the output side of the mirror shells 907 become greater. The inner mirror shells 908 with a smaller number of mirror segments have a maximum receiving angle on the source side of 41.8° which corresponds to a numerical aperture of 0.67.

The collector 902 has a numerical aperture on the source side of 0.946, which corresponds to a collection angle of +/−71°. The numerical aperture on the output side is 0.175.

The collector 902 includes an obscuration device (not shown here) serving to block those rays which are not reflected at the innermost mirror shell. As a result of this, a numerical aperture of 0.0325 is obscured on the output side. The ratio of the obscured numerical aperture in relation to the size of the transmitted numerical aperture on the output side is thus 1:5.4.

The maximum distance of the outermost mirror shell 907 from the collector axis 909 is 369 mm, which is more than one and a half times the distance of 232 mm between the innermost collector shell and the light source 903.

The distance of the light source 903 from the intermediate focus 5 is 2400 mm, which equals 10 times the distance of 232 mm between the innermost collector shell and the light source 903.

The individual mirror shells 907 and 908 are coated with ruthenium, palladium, rhodium, niobium, molybdenum or gold and have a uniform thickness of 6 mm, as measured in the surface-normal direction of a mirror surface.

The ratio of the effective solid angle on the source side and the subtended solid angle on the source side of the collector 902 is 0.82.

The number R of the Transmission-Thickness-Relation is 0.72 for the collector 902.

Figure 10:
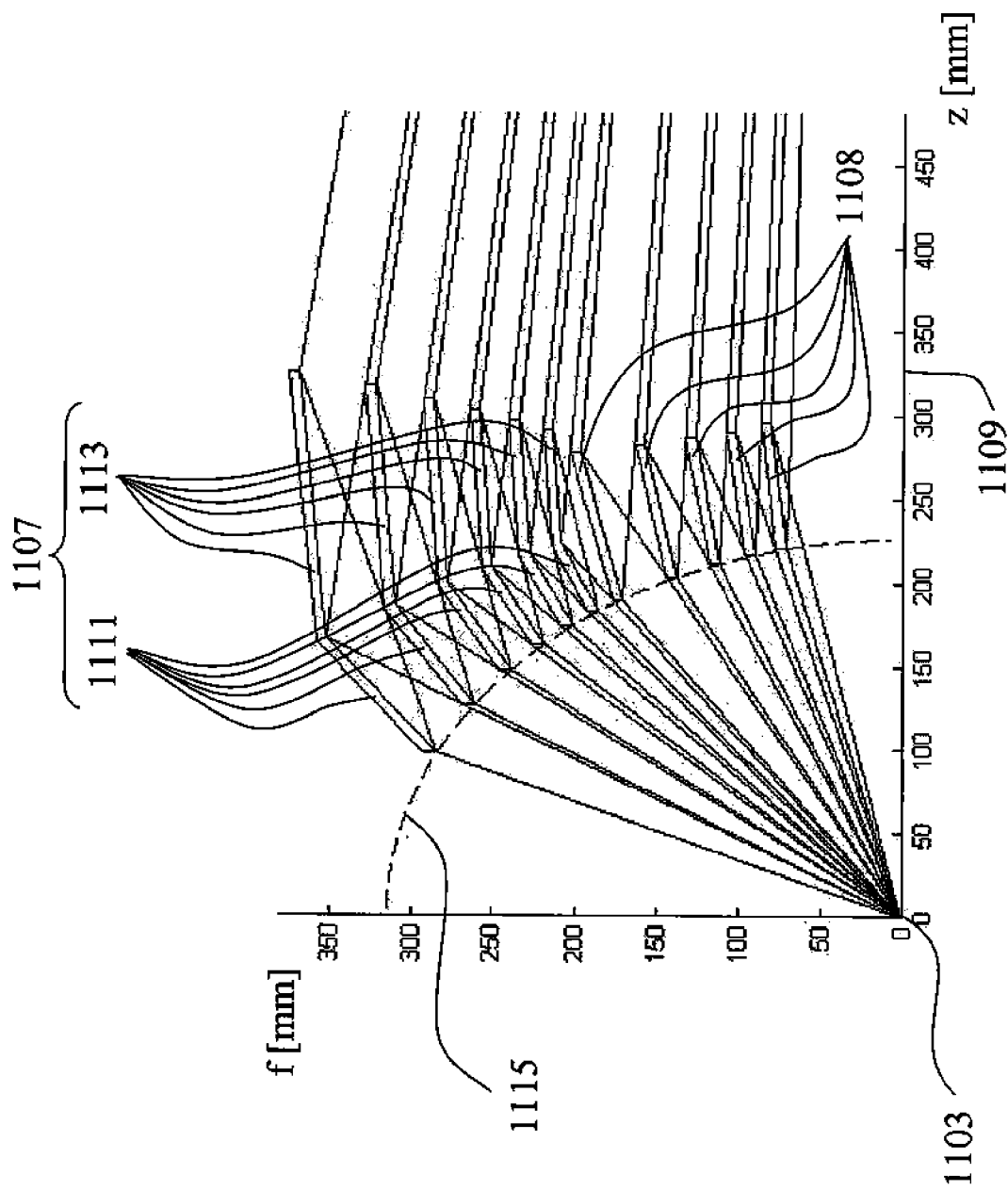

FIG. 9a shows a lens section to illustrate a collector 1102. FIG. 9b shows an enlarged detail of FIG. 9a in the area of the intermediate focus 1105. FIG. 10 shows a detail of FIG. 9a, with the same reference symbols being used for corresponding elements in FIGS. 9a and 10. The elements in FIGS. 9a and 10 which are analogous to those in FIGS. 1 and 2 have the same reference symbols as the latter but raised by 1100. For a description of these elements, the reader is referred to the description of FIGS. 1 and 2.

The collector 1102 projects an image of the light source 1103 into the intermediate focus 1105. The individual mirror shells of the collector 1102 are configured in such a way that the individual mirror shells generate different respective intermediate foci along the collector axis 1109 in the vicinity of the intermediate focus 1105, see FIG. 9b. The intermediate focus of the outermost shell lies directly on the intermediate focus 1105. The foci of the shells that follow in order from the outside towards the inside are each set back by 1 mm, and thus the focus of the innermost shell lies 10 mm ahead of the intermediate focus 1105. In relation to the distance between the first focus and the intermediate focus, the foci of the shells following each other from the outside to the inside are successively set back by 0.04%, so that the focus of the innermost shell lies 0.4% ahead of the intermediate focus 1105. This staggered arrangement of the foci of the individual mirror shells has the effect that in the far field of the collector 1102 the individual ring apertures of the mirror shells adjoin each other without gaps to form an uninterrupted aperture. However, none of the light lost through obscuration is recovered here; the only thing gained is a gapless output-side aperture of the collector. The collector 1102 therefore has almost the same ratio of 0.82 between the effective solid angle on the source side and the subtended solid angle on the source side as the collector 902, since the collector 1102 came out of the collector 902 only by moving the second foci.

The collector 1102 consists of eleven mirror shells 1107, 1108 which are arranged with rotational symmetry about the collector axis 1109. The collector 1102 according to FIG. 9a has six mirror shells 1107, each of which consists of two mirror segments 1111 and 1113 with different types of surfaces, which are arranged so that they follow each other in the direction of light propagation, while the five inner mirror shells 1108 are shaped like a section of an ellipsoid and thus have only one type of surface. The mirror segments 1111 in this arrangement are shaped like a section of a hyperboloid, while the mirror segments 1113 are shaped like a section of an ellipsoid.

TABLE 9

| shell | $r_h$ [mm] | $k_h$ | $zO_h$ [mm] | $r_e$ [mm] | $k_e$ | $zO_e$ [mm] |
|---|---|---|---|---|---|---|
| 1 | 173.4 | −1.680 | −75.5 | 97.7 | −0.938 | −710.3 |
| 2 | 135.0 | −1.483 | −60.9 | 74.4 | −0.953 | −718.9 |
| 3 | 107.0 | −1.381 | −49.2 | 60.3 | −0.961 | −691.2 |
| 4 | 85.7 | −1.319 | −39.9 | 50.9 | −0.967 | −641.9 |
| 5 | 68.9 | −1.278 | −32.3 | 44.1 | −0.971 | −583.0 |
| 6 | 55.5 | −1.247 | −26.2 | 38.9 | −0.974 | −521.5 |
| 7 | | | | 70.6 | −0.943 | −35.8 |
| 8 | | | | 46.1 | −0.962 | −23.3 |
| 9 | | | | 30.2 | −0.975 | −15.2 |
| 10 | | | | 19.5 | −0.984 | −9.8 |
| 11 | | | | 12.2 | −0.990 | −6.1 |

Table 9 contains the optical data for the collector 1102 of FIG. 9a. Shell 1 is the outermost shell, and shell 11 is the innermost shell. The surfaces of the mirror segments are described by equation (1).

TABLE 10

| shell | z1 [mm] | f1 [mm] | z2 [mm] | f2 [mm] | z3 [mm] | f3 [mm] |
|---|---|---|---|---|---|---|
| 1 | 97.7 | 283.7 | 166.5 | 351.8 | 325.2 | 368.8 |
| 2 | 126.9 | 260.3 | 185.9 | 309.9 | 318.1 | 321.9 |
| 3 | 147.5 | 238.4 | 199.5 | 277.1 | 310.3 | 286.5 |
| 4 | 162.6 | 218.6 | 209.7 | 250.3 | 303.1 | 258.0 |
| 5 | 174.1 | 200.8 | 217.6 | 227.6 | 296.9 | 234.3 |
| 6 | 183.2 | 184.6 | 224.0 | 208.0 | 291.7 | 213.9 |
| 7 | 190.2 | 170.3 | | | 277.9 | 196.7 |
| 8 | 203.4 | 137.7 | | | 282.4 | 157.0 |
| 9 | 211.6 | 111.5 | | | 286.5 | 126.4 |
| 10 | 216.9 | 89.6 | | | 290.7 | 101.4 |
| 11 | 220.4 | 70.8 | | | 295.5 | 80.3 |

The mirror segments of the mirror shells 1107 and the mirror shells 1108 only represent sections of the hyperboloids and ellipsoids that define their surfaces. Table 10 lists for the mirror shells 1107 the axial distances z1 and z2 between which the mirror segments 1111 to the source side extend in the form of a hyperboloid section and the axial distances z2 and z3 between which the mirror segments 1113 on the output side extend in the form of an ellipsoid section. The hyperboloid mirror segments and the ellipsoid mirror segments of the mirror segments 1107 follow each other in seamless transition. Thus, the individual mirror shells 1107 extend between the axial distances z1 and z3.

The mirror shells 1108 which are shaped like a section of an ellipsoid extend between the axial distances z1 and z3.

The radial distances of the mirror shells 1107 and 1108 and of the individual mirror segments 1111 and 1113 from the collector axis 1109 at the beginning and end of each mirror shell or each mirror segment are listed as f1, f2 and f3.

As can be seen in Table 10, progressing from the inside towards the outside, the respective axial distances z1 of the source-facing ends of the mirror shells 1107 become smaller.

The source-facing ends of the mirror shells 1107, 1108 lie on a virtual ellipsoid surface 1115 with a short half axis of 226.25 mm and a long half axis of 314.47 mm. The clearance space defined by this ellipsoid provides the space to install a device for removing the debris produced by the light source 1103.

Furthermore, the positions of the ends of the mirror shells 1107 farthest from the light source 1103 are defined in such a way that the ratio of the effective solid angle on the source side and the subtended solid angle on the source side of the collector is greater than 0.8.

As can be seen in Table 10, progressing from the inside towards the outside, the respective axial distances z3 of the ends at the output side of the mirror shells 1107 become greater. The inner mirror shells 1108 with a smaller number of mirror segments have a maximum receiving angle on the source side of 41.8° which corresponds to a numerical aperture of 0.67.

The collector 1102 has a numerical aperture on the source side of 0.946, which corresponds to a collection angle of +/−71°. The numerical aperture on the output side is 0.175.

The collector 1102 includes an obscuration device (not shown here) serving to block those rays which are not reflected at the innermost mirror shell. As a result of this, a numerical aperture of 0.0325 is obscured on the output side. The ratio of the obscured numerical aperture in relation to the size of the transmitted numerical aperture on the output side is thus 1:5.4.

The maximum distance of the outermost mirror shell 1107 from the collector axis 1109 is 369 mm, which is more than one and a half times the distance of 232 mm between the innermost collector shell and the light source 1103.

The distance of the light source 1103 from the intermediate focus 1105 is 2400 mm, which equals 10 times the distance of 232 mm between the innermost collector shell and the light source 1103.

The individual mirror shells 1107 and 1108 are coated with ruthenium, palladium, rhodium, niobium, molybdenum or gold and have a uniform thickness of 6 mm, as measured in the surface-normal direction of a mirror surface.

The number R of the Transmission-Thickness-Relation is 0.72 for the collector 11102.

Figure 11:
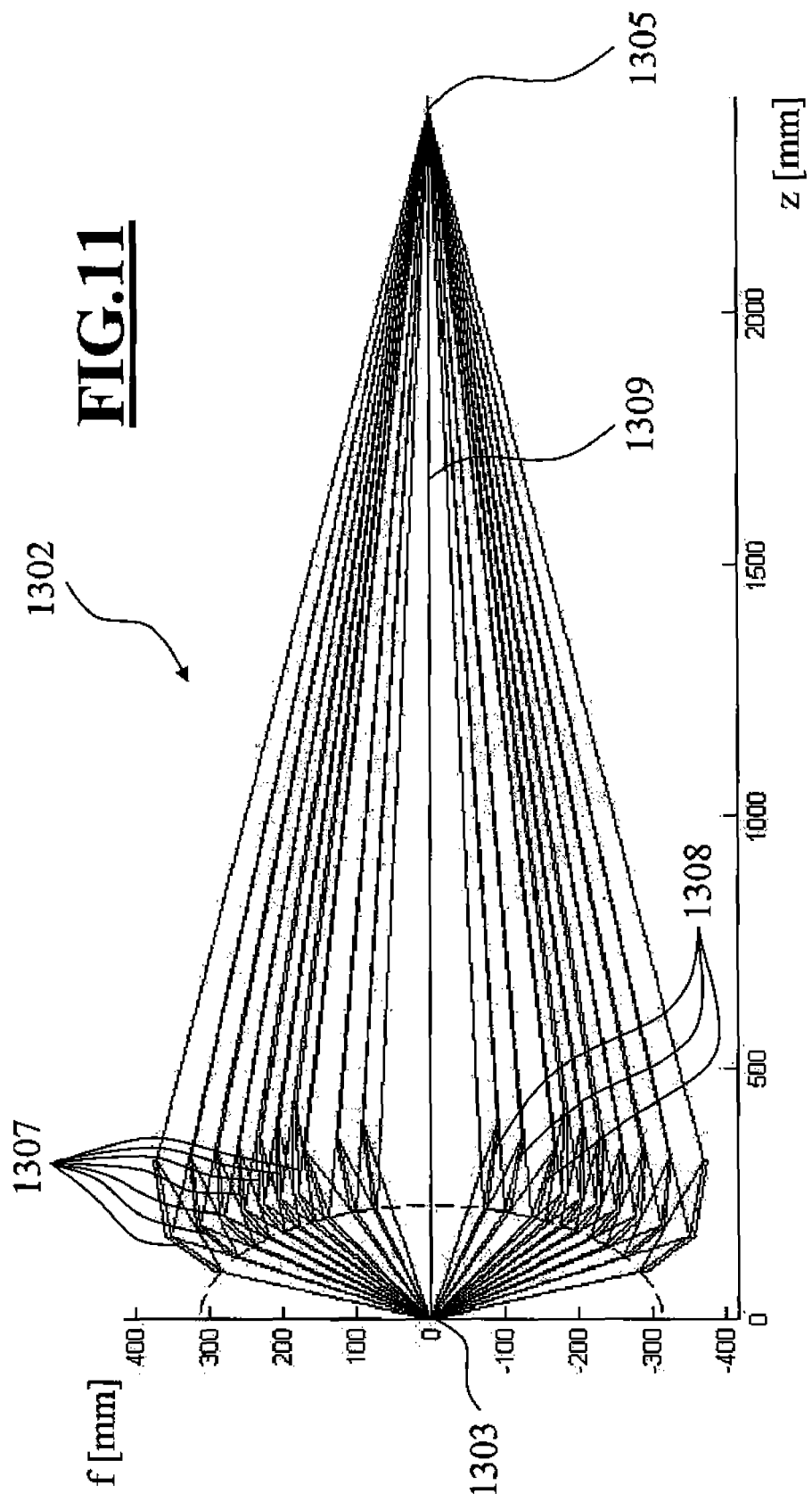
FIG. 11 represents a lens section of a collector.
Figure 12:
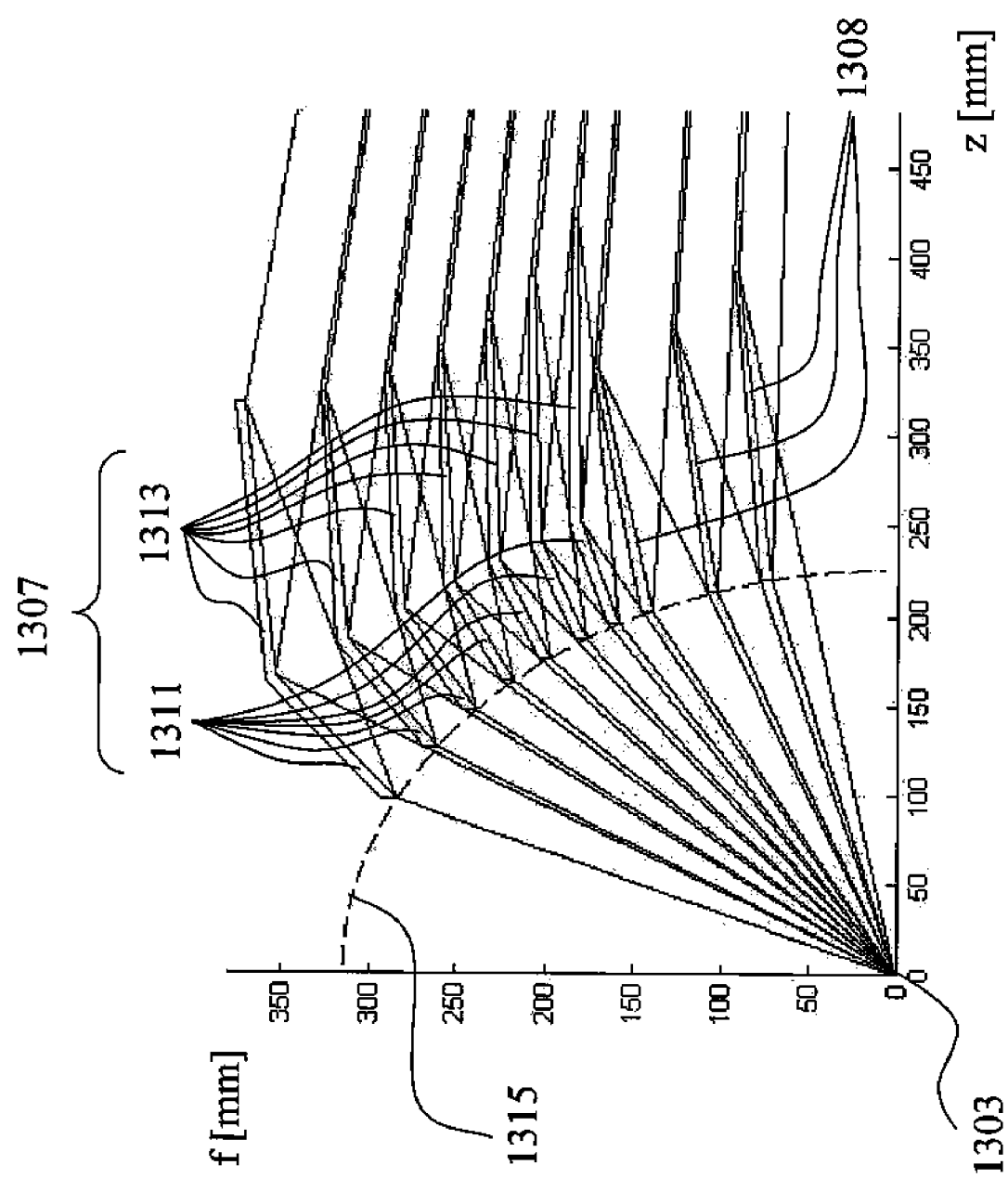
FIG. 12 represents a detail of FIG. 11.

FIG. 11 shows a lens section to illustrate a collector 1302. FIG. 12 shows a detail of FIG. 11, with the same reference symbols being used for corresponding elements in FIGS. 11 and 12. The elements in FIGS. 11 and 12 which are analogous to those in FIGS. 1 and 2 have the same reference symbols as the latter but raised by 1300. For a description of these elements, the reader is referred to the description of FIGS. 1 and 2.

The collector 1302 projects an image of the light source 1303 into the intermediate focus 1305. The collector 1302 consists of ten mirror shells 1307, 1308 which are arranged with rotational symmetry about the collector axis 1309. The collector 1302 according to FIG. 11 has seven mirror shells 1307, each of which consists of two mirror segments 1311 and 1313 with different types of surfaces, which are arranged so that they follow each other in the direction of light propagation, while the three inner mirror shells 1308 are shaped like a section of an ellipsoid and thus have only one type of surface. The mirror segments 1311 in this arrangement are shaped like a section of a hyperboloid, while the mirror segments 1313 are shaped like a section of an ellipsoid.

TABLE 11

| shell | $r_h$ [mm] | $k_h$ | $zO_h$ [mm] | $r_e$ [mm] | $k_e$ | $zO_e$ [mm] |
|---|---|---|---|---|---|---|
| 1 | 171.9 | −1.721 | −74.3 | 100.9 | −0.935 | −676.7 |
| 2 | 135.7 | −1.484 | −61.2 | 75.2 | −0.952 | −721.4 |
| 3 | 109.1 | −1.343 | −50.5 | 57.7 | −0.964 | −765.8 |
| 4 | 88.7 | −1.248 | −41.9 | 44.5 | −0.973 | −822.4 |
| 5 | 72.4 | −1.177 | −34.7 | 34.0 | −0.980 | −904.8 |
| 6 | 58.9 | −1.123 | −28.6 | 25.4 | −0.985 | −1031.6 |
| 7 | 47.6 | −1.081 | −23.3 | 18.4 | −0.990 | −1236.0 |
| 8 |  |  |  | 46.7 | −0.962 | −23.6 |
| 9 |  |  |  | 25.0 | −0.979 | −12.6 |
| 10 |  |  |  | 12.2 | −0.990 | −6.1 |

Table 11 contains the optical data for the collector 1302 of FIG. 11. Shell 1 is the outermost shell, and shell 10 is the innermost shell. The surfaces of the mirror segments are described by equation (1).

TABLE 12

| shell | z1 [mm] | f1 [mm] | z2 [mm] | f2 [mm] | z3 [mm] | f3 [mm] |
|---|---|---|---|---|---|---|
| 1 | 97.7 | 283.7 | 166.1 | 352.6 | 317.9 | 370.1 |
| 2 | 126.5 | 260.7 | 187.6 | 312.2 | 324.7 | 324.5 |
| 3 | 147.7 | 238.2 | 204.4 | 279.2 | 334.2 | 288.5 |
| 4 | 163.9 | 216.8 | 218.3 | 250.8 | 347.3 | 258.0 |
| 5 | 176.8 | 196.3 | 230.5 | 225.4 | 365.0 | 231.0 |
| 6 | 187.3 | 176.5 | 241.6 | 202.0 | 388.8 | 206.0 |
| 7 | 195.9 | 157.3 | 252.2 | 179.8 | 421.2 | 182.2 |
| 8 | 203.1 | 138.6 |  |  | 337.9 | 169.6 |
| 9 | 214.2 | 101.4 |  |  | 360.4 | 125.6 |
| 10 | 220.4 | 70.8 |  |  | 392.3 | 90.1 |

The mirror segments of the mirror shells 1307 and the mirror shells 1308 only represent sections of the hyperboloids and ellipsoids that define their surfaces. Table 12 lists for the mirror shells 1307 the axial distances z1 and z2 between which the mirror segments 1311 to the source side extend in the form of a hyperboloid section and the axial distances z2 and z3 between which the mirror segments 1313 on the output side extend in the form of an ellipsoid section. The hyperboloid mirror segments and the ellipsoid mirror segments of the mirror segments 1307 follow each other in seamless transition. Thus, the individual mirror shells 1307 extend between the axial distances z1 and z3.

The mirror shells 1308 which are shaped like a section of an ellipsoid extend between the axial distances z1 and z3.

The radial distances of the mirror shells 1307 and 1308, and of the individual mirror segments 1311 and 1313 from the collector axis 1309 at the beginning and end of each mirror shell or each mirror segment are listed as f1, f2 and f3.

As can be seen in Table 12, progressing from the inside towards the outside, the respective axial distances z1 of the source-facing ends of the mirror shells 1307 become smaller.

The source-facing ends of the mirror shells 1307, 1308 lie on a virtual ellipsoid surface 1315 with a short half axis of 226.25 mm and a long half axis of 314.47 mm. The clearance space defined by this ellipsoid provides the space to install a device for removing the debris produced by the light source 1303.

The ring aperture elements received on the source side by the individual mirror shells adjoin each other almost contiguously, meaning that the aperture on the source side has no gaps between the individual ring aperture elements except for interruptions that are due to the finite thickness of the mirror shells 1307 and 1308. The positions for the ends of the mirror shells 1307 and 1308 that face away from the light source 1303 are defined in such a way that the ring elements associated with the respective mirror shells, which illuminate a plane which in the light direction follows the collector 1302, adjoin each other to a large extent continuously, meaning that the output-side aperture of the collector has likewise no gaps between the individual output-side ring aperture elements except for interruptions that are due to the finite thickness of the mirror shells 1307 and 1308. Furthermore, the positions of the ends of the mirror shells 1307 farthest from the light source 1303 are defined in such a way that the ratio of the effective solid angle on the source side and the subtended solid angle on the source side of the collector is greater than 0.8.

As can be seen in Table 12, progressing from the inside towards the outside, the respective axial distances z3 of the ends at the output side of the mirror shells 1307 become smaller. The inner mirror shells 1308 with a smaller number of mirror segments have a maximum receiving angle on the source side of 34.3° which corresponds to a numerical aperture of 0.56.

The collector 1302 has a numerical aperture on the source side of 0.946, which corresponds to a collection angle of +/−71°. The numerical aperture on the output side is 0.175.

The collector 1302 includes an obscuration device (not shown here) serving to block those rays which are not reflected at the innermost mirror shell. As a result of this, a numerical aperture of 0.0325 is obscured on the output side. The ratio of the obscured numerical aperture in relation to the size of the transmitted numerical aperture on the output side is thus 1:5.4.

The maximum distance of the outermost mirror shell 1307 from the collector axis 1309 is 370 mm, which is more than one and a half times the distance of 232 mm between the innermost collector shell and the light source 1303.

The distance of the light source 1303 from the intermediate focus 5 is 2400 mm, which equals 10 times the distance of 232 mm between the innermost collector shell and the light source 1303.

The individual mirror shells 1307 and 1308 are coated with ruthenium, palladium, rhodium, niobium, molybdenum or gold and have a uniform thickness of 6 mm on the side closer to the light source, and a thickness of 3 mm on the side that faces away from the light source, wherein the thickness is measured in the surface-normal direction of a mirror surface. By reducing the thickness of the mirror shell on the far side from the light source, the obscuration effects of the mirror shells are reduced by an additional amount and the gaps between the individual ring apertures of the collector are smaller than in the fourth embodiment, while at the same time the ratio of 0.84 between the effective solid angle on the source side and the subtended solid angle on the source side of the collector is greater than the collector shown in FIG. 7.

The number R of the Transmission-Thickness-Relation is 0.72 for the collector 1302.

Figure 13:
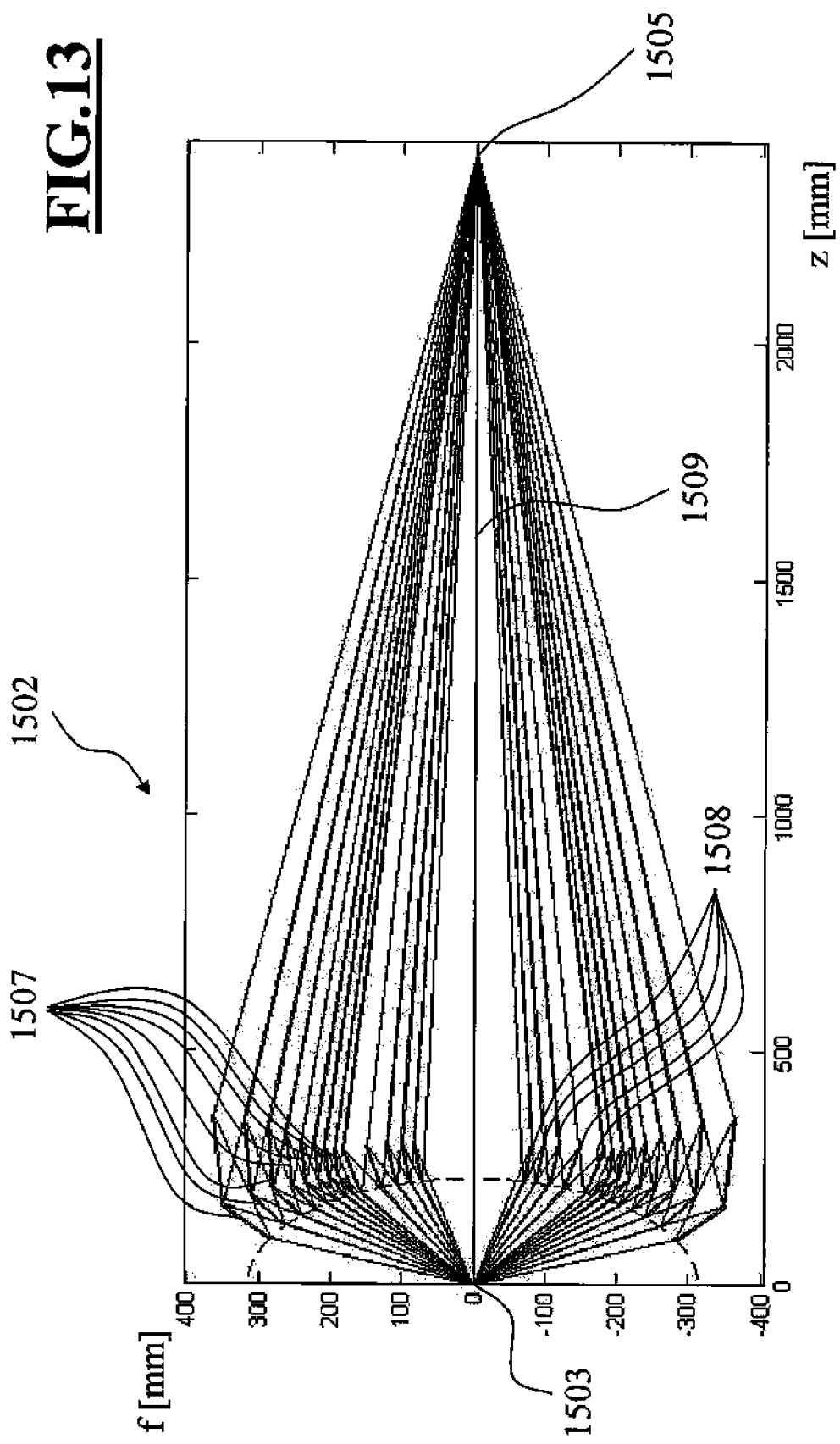
FIG. 13 represents a lens section of a collector.
Figure 14:
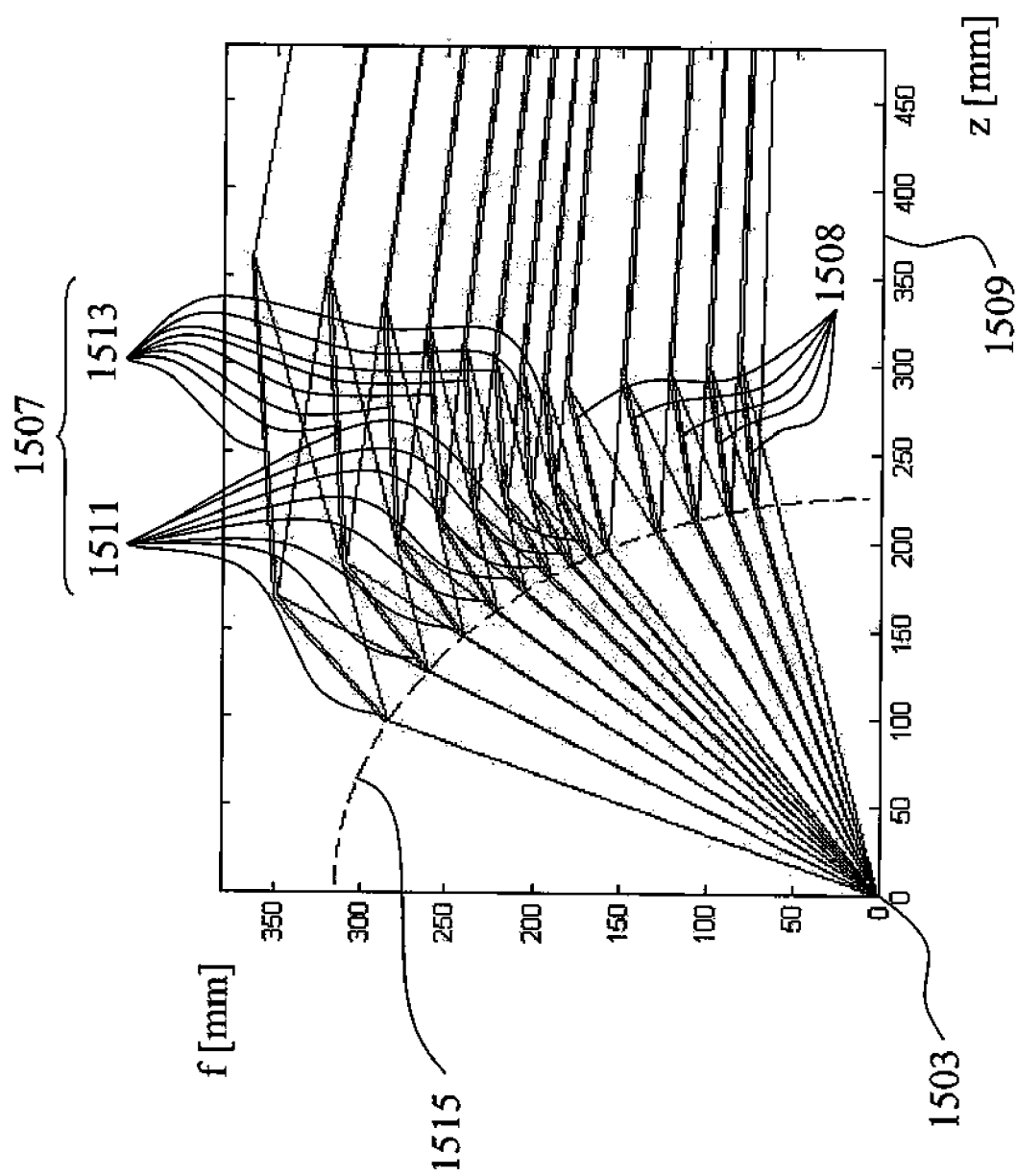
FIG. 14 represents a detail of FIG. 13.

FIG. 13 shows a lens section to illustrate a collector 1502. FIG. 14 shows a detail of FIG. 13, with the same reference symbols being used for corresponding elements in FIGS. 13 and 14. The elements in FIGS. 13 and 14 which are analogous to those in FIGS. 1 and 2 have the same reference symbols as the latter but raised by 1500. For a description of these elements, the reader is referred to the description of FIGS. 1 and 2.

The collector 1502 projects an image of the light source 1503 into the intermediate focus 1505. The collector 1502 consists of thirteen mirror shells 1507, 1508 which are arranged with rotational symmetry about the collector axis 1509. The collector 1502 according to FIG. 13 has eight mirror shells 1507, each of which consists of two mirror segments 1511 and 1513 with different types of surfaces, which are arranged so that they follow each other in the direction of light propagation, while the five inner mirror shells 1508 are shaped like a section of an ellipsoid and thus have only one type of surface. The mirror segments 1511 in this arrangement are shaped like a section of a hyperboloid, while the mirror segments 1513 are shaped like a section of an ellipsoid.

TABLE 13

| shell | $r_h$ [mm] | $k_h$ | $zO_h$ [mm] | $r_e$ [mm] | $k_e$ | $zO_e$ [mm] |
|---|---|---|---|---|---|---|
| 1 | 179.6 | −1.520 | −80.4 | 83.9 | −0.950 | −893.8 |
| 2 | 140.6 | −1.379 | −64.7 | 64.7 | −0.961 | −903.5 |
| 3 | 112.0 | −1.317 | −52.1 | 54.4 | −0.967 | −838.5 |
| 4 | 90.1 | −1.285 | −42.2 | 48.1 | −0.970 | −740.7 |
| 5 | 73.2 | −1.266 | −34.4 | 43.8 | −0.971 | −640.4 |
| 6 | 59.8 | −1.252 | −28.2 | 40.5 | −0.973 | −551.4 |
| 7 | 49.3 | −1.240 | −23.3 | 37.7 | −0.974 | −476.7 |
| 8 | 40.8 | −1.228 | −19.4 | 35.2 | −0.975 | −415.2 |
| 9 | | | | 59.0 | −0.952 | −29.9 |
| 10 | | | | 39.6 | −0.968 | −20.0 |
| 11 | | | | 26.8 | −0.978 | −13.5 |
| 12 | | | | 18.2 | −0.985 | −9.1 |
| 13 | | | | 12.2 | −0.990 | −6.1 |

Table 13 contains the optical data for the collector 1502 of FIG. 13. Shell 1 is the outermost shell, and shell 13 is the innermost shell. The surfaces of the mirror segments are described by equation (1).

TABLE 14

| shell | z1 [mm] | f1 [mm] | z2 [mm] | f2 [mm] | z3 [mm] | f3 [mm] |
|---|---|---|---|---|---|---|
| 1 | 97.7 | 283.7 | 168.2 | 348.5 | 361.1 | 362.4 |
| 2 | 126.9 | 260.3 | 187.6 | 308.4 | 348.9 | 318.3 |
| 3 | 147.0 | 239.1 | 201.2 | 277.6 | 334.6 | 285.9 |
| 4 | 161.4 | 220.3 | 211.1 | 252.9 | 321.1 | 260.4 |
| 5 | 172.2 | 204.0 | 218.7 | 232.6 | 309.9 | 239.5 |
| 6 | 180.5 | 189.6 | 224.7 | 215.4 | 301.1 | 221.8 |
| 7 | 187.0 | 177.0 | 229.5 | 200.6 | 294.4 | 206.5 |
| 8 | 192.3 | 165.8 | 233.6 | 187.7 | 289.4 | 193.1 |
| 9 | 196.5 | 155.8 | | | 288.3 | 180.9 |
| 10 | 206.8 | 127.7 | | | 292.7 | 147.0 |
| 11 | 213.3 | 105.0 | | | 296.2 | 120.4 |
| 12 | 217.5 | 86.4 | | | 299.3 | 98.9 |
| 13 | 220.4 | 70.8 | | | 302.1 | 81.0 |

The mirror segments of the mirror shells 1507 and the mirror shells 1508 only represent sections of the hyperboloids and ellipsoids that define their surfaces. Table 14 lists for the mirror shells 1507 the axial distances z1 and z2 between which the mirror segments 1511 to the source side extend in the form of a hyperboloid section and the axial distances z2 and z3 between which the mirror segments 1513 on the output side extend in the form of an ellipsoid section. The hyperboloid mirror segments and the ellipsoid mirror segments of the mirror segments 1507 follow each other in seamless transition. Thus, the individual mirror shells 1507 extend between the axial distances z1 and z3.

The mirror shells 1508 which are shaped like a section of an ellipsoid extend between the axial distances z1 and z3.

The radial distances of the mirror shells 1507 and 1508, and of the individual mirror segments 1511 and 1513 from the collector axis 1509 at the beginning and end of each mirror shell or each mirror segment are listed as f1, f2 and f3.

As can be seen in Table 14, progressing from the inside towards the outside, the respective axial distances z1 of the source-facing ends of the mirror shells 1507 become smaller.

The source-facing ends of the mirror shells 1507, 1508 lie on a virtual ellipsoid surface 1515 with a short half axis of 226.25 mm and a long half axis of 314.47 mm. The clearance space defined by this ellipsoid provides the space to install a device for removing the debris produced by the light source 1503.

The ring aperture elements received on the source side by the individual mirror shells adjoin each other almost contiguously, meaning that the aperture on the source side has no gaps between the individual ring aperture elements except for interruptions that are due to the finite thickness of the mirror shells 1507 and 1508. The positions for the ends of the mirror shells 1507 and 1508 that face away from the light source 1503 are defined in such a way that the ring elements associated with the respective mirror shells, which illuminate a plane which in the light direction follows the collector 1502, adjoin each other to a large extent continuously, meaning that the output-side aperture of the collector has likewise no gaps between the individual output-side ring aperture elements except for interruptions that are due to the finite thickness of the mirror shells 1507 and 1508. Furthermore, the positions of the ends of the mirror shells 1507 farthest from the light source 1503 are defined in such a way that the ratio of the effective solid angle on the source side and the subtended solid angle on the source side of the collector is greater than 0.8.

As can be seen in Table 14, progressing from the inside towards the outside, the respective axial distances z3 of the ends at the output side of the mirror shells 1507 become greater. The inner mirror shells 1508 with a smaller number of mirror segments have a maximum receiving angle on the source side of 38.4° which corresponds to a numerical aperture of 0.62.

The collector 1502 has a numerical aperture on the source side of 0.946, which corresponds to a collection angle of +/−71°. The numerical aperture on the output side is 0.175.

The collector 1502 includes an obscuration device (not shown here) serving to block those rays which are not reflected at the innermost mirror shell. As a result of this, a numerical aperture of 0.0325 is obscured on the output side. The ratio of the obscured numerical aperture in relation to the size of the transmitted numerical aperture on the output side is thus 1:5.4.

The maximum distance of the outermost mirror shell 1507 from the collector axis 1509 is 362 mm, which is more than one and a half times the distance of 232 mm between the innermost collector shell and the light source 1503.

The distance of the light source 1503 from the intermediate focus 1505 is 2400 mm, which equals 10 times the distance of 232 mm between the innermost collector shell and the light source 1503.

The individual mirror shells 1507 and 1508 are coated with ruthenium, palladium, rhodium, niobium, molybdenum or gold and have a uniform thickness of 2 mm as measured in the surface-normal direction of a mirror surface. Due to the thin shells and the arrangement of the axial distances of the individual mirror shells, this collector 1502 has only small obscurations, whereby a ratio of 0.93 is obtained between the effective solid angle on the source side and the subtended solid angle on the source side of the collector.

The number R of the Transmission-Thickness-Relation is 0.88 for the collector 1502.

TABLE 15

| collector | min. angle | max. angle | subtended solid angle [sr] | effective solid angle [sr] | ratio |
|---|---|---|---|---|---|
| 1 | 14.3 | 70.0 | 3.945 | 3.638 | 0.92 |
| 302 | 12.7 | 70.0 | 3.984 | 3.757 | 0.94 |
| 702 | 15.0 | 75.0 | 4.442 | 4.181 | 0.94 |
| 902 | 15.2 | 71.0 | 4.017 | 3.306 | 0.82 |
| 1102 | 15.2 | 71.0 | 4.017 | 3.308 | 0.82 |
| 1302 | 12.9 | 71.0 | 4.078 | 3.435 | 0.84 |
| 1502 | 15.0 | 71.0 | 4.023 | 3.733 | 0.93 |

For a synopsis of all collectors of this application, Table 15 shows for each collector the minimum and maximum angle of the rays transmitted through the collector and the corresponding subtended solid angle on the source side in steradian, as well as the effective solid angle on the source side in steradian, with the resultant ratio of effective solid angle and subtended solid angle on the source side of the collector. As can be concluded from Table 15, regardless of an optimal choice of the positions of the ends of the mirror shells in accordance with the rules explained above, the ratio of effective solid angle and subtended solid angle on the source side of the collector depends in addition on the thickness of the mirror shells. Only collectors in which at least one mirror shell has a maximum thickness of at most 3.5 mm have a ratio greater than 0.9 between effective solid angle and subtended solid angle on the source side of the collector. In general the following equation R=0.96−0.04/mm*D holds for the Transmission-Thickness-Relation for the collectors above, wherein D is the maximum thickness of the mirrors shells measured in mm and R is a number for the lower limit for the ratio of the effective solid angle on the source side and the subtended solid angle on the source side of a collector.

Figure 15:
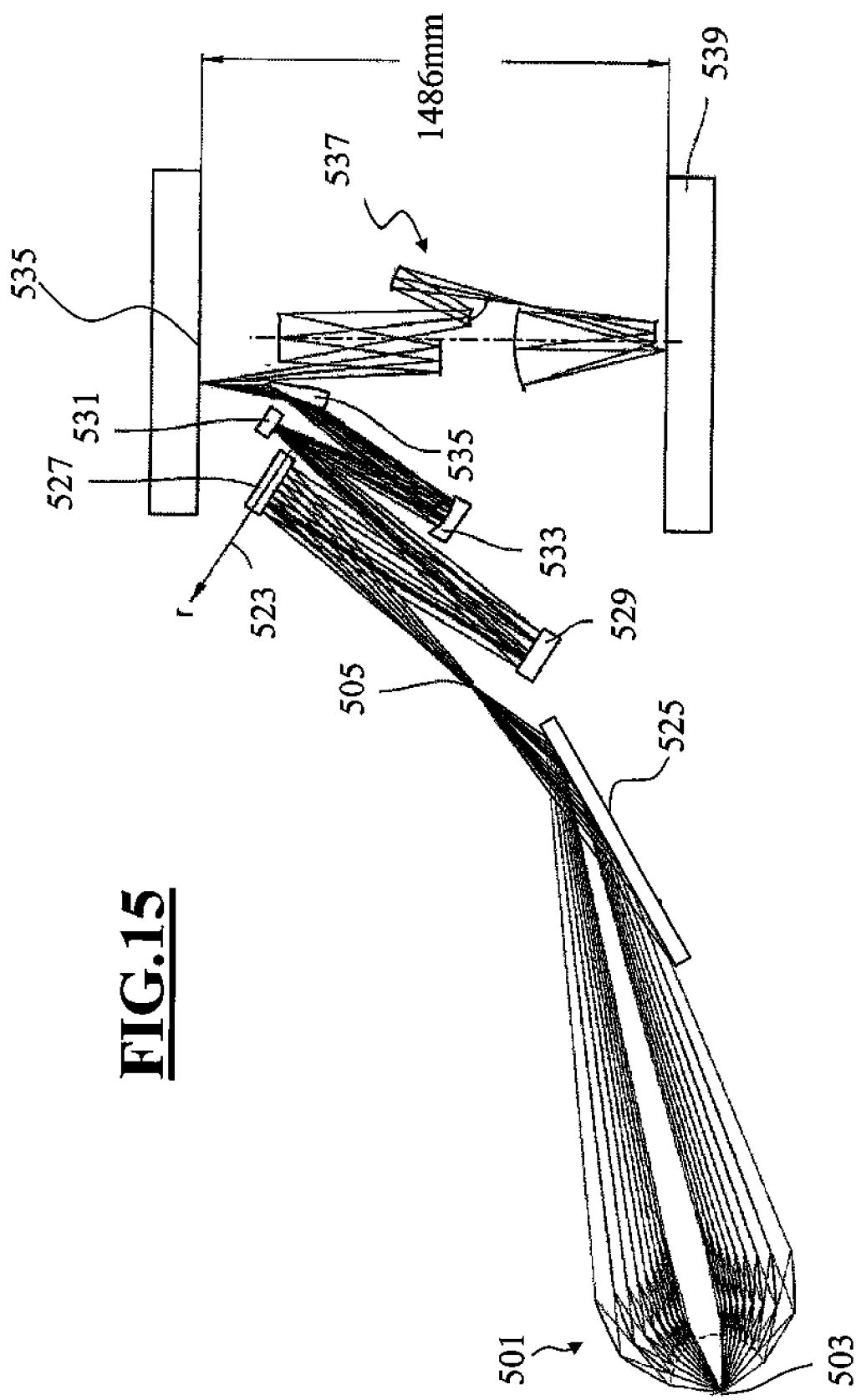
FIG. 15 represents a projection exposure apparatus with a collector according to FIG. 1.

FIG. 15 illustrates a projection exposure apparatus as used for example for the manufacture of microelectronic components. The projection exposure apparatus includes a light source 503 as well as a nested collector 501 for the illumination of a plane 523. The collector 501 matches the collector 501 shown in FIGS. 1 and 2. The planar mirror 525 which is arranged in the light path between the nested collector 501 and the intermediate focus 505 can be configured as a spectral grid filter. The intermediate focus 505 is followed downstream in the direction of the light by a reflective honeycomb condenser with the field honeycomb plate 527 and the pupil honeycomb plate 529. The field honeycomb plate 527 is located in the plane 523 which is illuminated by the collector 501. The elements 531, 533 and 535 have the same effect as a field lens which forms an image of the pupil honeycomb plate 529 in the entry pupil of the projection objective 537. The illumination system consisting of the optical components 501 to 535 illuminates the structured mask 535. The projection objective 537 forms an image of the mask 535 on the light-sensitive substrate 539. For a more detailed description of the individual components of the projection exposure apparatus, the reader is referred to the description of FIGS. 20 to 23 of US 2004/0065817.

Figure 16:
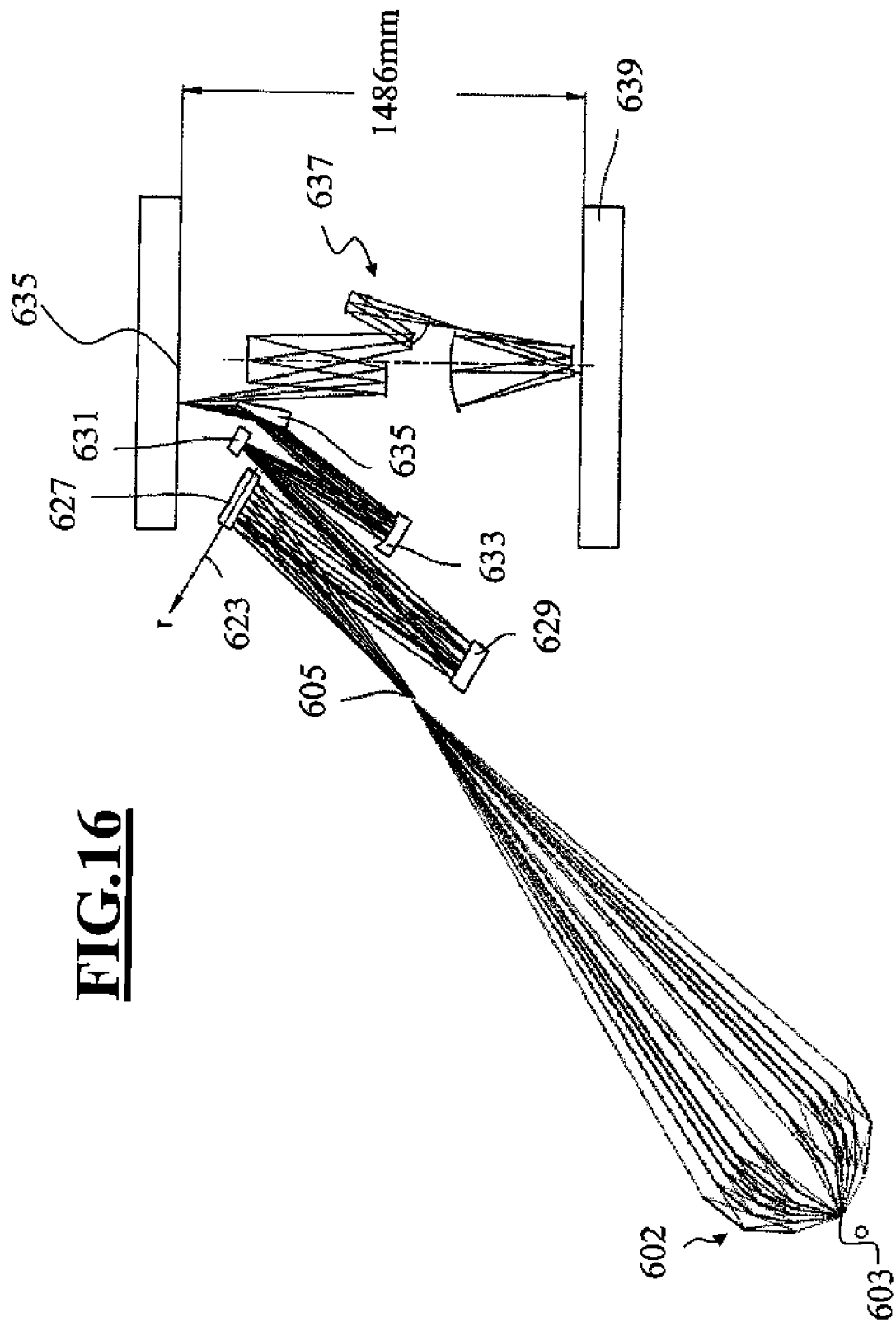
FIG. 16 represents a projection exposure apparatus with a collector according to FIG. 3.

FIG. 16 illustrates a projection exposure apparatus. The elements in FIG. 16 which are analogous to those of FIG. 15 have the same reference symbols as in FIG. 15, but raised by 100. For a description of these elements, the reader is referred to the description of FIG. 15.

The projection exposure apparatus of FIG. 16 is distinguished from the projection exposure apparatus of FIG. 15 in that the collector 602 matches the collector 302 shown in FIG. 4 (not shown is the alternative use of the collectors 702, 902, 1102, 1302 and 1502 in place of the collector 602), whose inner mirror shells have the shape of an ellipsoid section, while each of the outer mirror shells consists of two mirror segments.

Furthermore, the projection exposure apparatus of FIG. 16 lacks a spectral grid filter between the collector 602 and the intermediate focus 605.

What is claimed is:

1. A collector, comprising:
    at least two mirror shells arranged inside each other around a collector axis, wherein:
    the collector is configured to be used in an illumination system of a microlithography projection exposure apparatus;
    the collector is configured so that, during use, a light source side of the collector can collect light from a light source;
    a maximum thickness of at least one of the least two mirror shells is greater than 0.5 mm;
    a ratio of an effective solid angle of the collector on the light source side to the subtended solid angle of the collector on the light source side is greater than 0.8;
    the ratio of the effective solid angle of the collector on the light source side to the subtended solid angle of the collector on the light source side is greater than R, where R=0.96−0.04/mm*D, and D is a maximum thickness of the at least two mirror shells measured in mm.

2. The collector according to claim 1, wherein the ratio of the effective solid angle of the collector on the light source side to the subtended solid angle of the collector on the light source side is greater than 0.9.

3. The collector according to claim 1, wherein:
    each of the mirror shells has a first focus on the source side and a second focus;
    for at least two mirror shells the second foci have unequal distances along the collector axis from the respective first focus on the source side; and
    a difference between the unequal distances is greater than 0.01% of the distance of one the second foci of the at least two mirror shells from the respective first focus on the source side.

4. The collector according to claim 1, wherein a thickness of at least one of the mirror shells on a side opposite the light source side is less than the maximum thickness of the mirror shell by more than 10% relative to the maximum thickness of the mirror shell.

5. the collector according to claim 1, wherein the maximum thickness of at least one of the mirror shells is at most 3.5 mm.

6. The collector according to claim 1, wherein the collector comprises at least 5 mirror shells.

7. The collector according to claim 1, wherein the collector comprises at least 9 mirror shells.

8. The collector according to claim 1, wherein the collector comprises at most 15 mirror shells.

9. The collector according to claim 1, wherein the collector has a numerical aperture on the light source side that is greater than or equal to 0.8.

10. The collector according to claim 1, wherein the collector has a numerical aperture on the light source side that is greater than or equal to 0.85.

11. The collector according to claim 1, wherein the collector has a numerical aperture on the light source side that is greater than or equal to 0.9.

12. The collector according to claim 1, wherein at least one mirror shell has two mirror segments.

13. The collector according to claim 1, wherein at least one mirror shell has three mirror segments.

14. The collector according to claim 1, wherein:
    the mirror shells have a first focus;
    first axial distances are defined as distances along the collector axis between the first focus of the mirror shells and an end of the mirror shells that faces towards the first focus; and
    at least two mirror shells have first axial distances of unequal magnitude.

15. The collector according to claim 14, wherein the at least two mirror shells have at least two mirror segments.

16. The collector according to claim 15, wherein the collector has only mirror shells with an equal number of mirror segments.

17. The collector according to claim 16, wherein:
    second axial distances are defined as distances along the collector axis between the first focus of the mirror shells and the end of the mirror shells that faces away from the first focus; and
    of any two neighboring mirror shells the outer of the two neighboring mirror shells has a smaller or equally large first axial distance and a smaller second axial distance in comparison to the inner of the two neighboring mirror shells.

18. The collector according to claim 14, wherein the collector comprises at least two outer mirror shells with at least two mirror segments, and at least one inner mirror shell with at least one mirror segment,
    wherein:
    distances between the first focus of the mirror shells and the end of the mirror shells facing away from the first focus are defined as second axial distances;
    of any two neighboring mirror shells with an equal number of mirror segments, if further inner mirror shells with a lesser number of mirror segments are present and if the inner mirror shells with a lesser number of mirror segments have a maximum numerical aperture of less than 0.6 on the source side, the outer of the two neighboring mirror shells has a smaller or equally large first axial distance and a smaller second axial distance in comparison to the inner of the two neighboring mirror shells.

19. The collector according to claim 14, wherein the collector comprises at least two outer mirror shells with at least two mirror segments, and at least one inner mirror shell with at least one mirror segment,
    wherein:
    distances between the first focus of the mirror shells and the end of the mirror shells facing away from the first focus are defined as second axial distances; and
    of any two neighboring mirror shells with an equal number of mirror segments, if further inner mirror shells with a lesser number of mirror segments are present and if the inner mirror shells with a lesser number of mirror segments have a maximum numerical aperture of greater than or equal to 0.6 on the source side, the outer of the two neighboring mirror shells has a smaller or equally large first axial distance and a greater second axial distance in comparison to the inner of the two neighboring mirror shells.

20. A collector, comprising:
    at least three mirror shells arranged inside each other around a collector axis,
    wherein:
    the collector is configured to be used in an illumination system of a microlithography projection exposure apparatus;

the collector is configured so that, during use, a light source side of the collector can collect light from a light source;

each of the mirror shells extends between a first axial distance and a second axial distance;

the axial distances are defined along the collector axis originating from the light source;

at least two mirror shells have first axial distances of unequal magnitude;

for any two neighboring mirror shells, an outer of the two neighboring mirror shells has a shorter or equally large first axial distance and a shorter second axial distance in comparison to an inner of the two neighboring mirror shells; and at least one of the mirror shells has three mirror segments.

21. The collector according to claim 20, wherein:

a maximum thickness of at least one of the mirror shells is greater than 0.5 mm;

a ratio of an effective solid angle of the collector on the light source side to the subtended solid angle of the collector on the light source side is greater than 0.8; and the ratio of the effective solid angle of the collector on the light source side to the subtended solid angle of the collector on the light source side is greater than R, where R=0.96−0.04/mm*D, and D is a maximum thickness of the at least two mirror shells measured in mm.

22. The collector according to claim 21, wherein ratio of the effective solid angle of the collector on the light source side to the subtended solid angle of the collector on the light source side is greater than 0.9.

23. The collector according to claim 20, wherein the collector comprises at least 9 mirror shells.

24. The collector according to claim 20, wherein the collector has a numerical aperture on the light source side greater than or equal to 0.8.

25. The collector according to claim 20, wherein the collector has a numerical aperture on the light source side greater than or equal to 0.9.

26. The collector according to claim 20, wherein at least one of the mirror shells has two mirror segments.

27. A collector, comprising:

at least two mirror shells arranged inside each other around a collector axis; and a light source wherein:

the collector is configured to be used in an illumination system of a microlithography projection exposure apparatus;

the collector is configured so that, during use, a light source side of the collector can collect light from the light source;

each mirror shell has a distance from the light source;

the distances of all of the mirror shells lie on an ellipsoid around the light source within a variation of +/−10%;

half axes of the ellipsoid are greater than 150mm and smaller than 350 mm; and the ellipsoid has at least two unequal half axes with a difference between the half axes of more than 5% relative to the smallest of the half axes.

28. The collector according to claim 27, wherein:

a maximum thickness of at least one of the mirror shells is greater than 0.5 mm;

a ratio of an effective solid angle of the collector on the light source side to the subtended solid angle of the collector on the light source side is greater than 0.8; and the ratio of the effective solid angle of the collector on the light source side to the subtended solid angle of the collector on the light source side is greater than R, where R=0.96−0.04/mm*D, and D is a maximum thickness of the at least two mirror shells measured in mm.

29. The collector according to claim 28, wherein the ratio of the effective solid angle of the collector on the light source side to the subtended solid angle of the collector on the light source side is greater than 0.9.

30. The collector according to claim 27, wherein the at least two mirror shells comprise at least two mirror segments.

31. The collector according to claim 30, wherein the collector comprises only mirror shells with an equal number of mirror segments.

32. The collector according to claim 31, wherein:

distances along the collector axis between the light source and the ends of the mirror shells that face towards the light source are defined as first axial distances;

distances along the collector axis between the light source and the ends of the mirror shells that face away from the light source are defined as second axial distances;, of any two neighboring mirror shells, an outer of the two neighboring mirror shells has a smaller or equally large first axial distance and a smaller second axial distance in comparison to an inner of the two neighboring mirror shells.

33. The collector according to claim 27, wherein the collector comprises at least two outer mirror shells with at least two mirror segments, and at least one inner mirror shell with at least one mirror segment, wherein:

distances between the light source and the end of the mirror shells facing towards the light source are defined as first axial distances;

distances along the collector axis between the light source and the ends of the mirror shells that face away from the light source are defined as second axial distances; and of any two neighboring mirror shells with an equal number of mirror segments, if further inner mirror shells with a lesser number of mirror segments are present and if the inner mirror shells with a lesser number of mirror segments have a maximum numerical aperture of less than 0.6 on the source side, the outer of the two neighboring mirror shells has a smaller or equally large first axial distance and a smaller second axial distance in comparison to the inner of the two neighboring mirror shells.

34. The collector according to claim 27, wherein the collector comprises at least two outer mirror shells with at least two mirror segments, and at least one inner mirror shell with at least one mirror segment, wherein:

distances between the light source and the end of the mirror shells facing towards the light source are defined as first axial distances;

distances along the collector axis between the light source and the ends of the mirror shells that face away from the light source are defined as second axial distances; and of any two neighboring mirror shells with an equal number of mirror segments, if further inner mirror shells with a lesser number of mirror segments are present and if the inner mirror shells with a lesser number of mirror segments have a maximum numerical aperture of greater than or equal to 0.6 on the source side, the outer of the two neighboring mirror shells has a smaller or equally large first axial distance and a greater second axial distance in comparison to the inner of the two neighboring mirror shells.

35. A system, comprising:
the collector of claim 1,
wherein the system is an illumination system configured to be used with wavelengths in the EUV range, and the collector is configured so that, during use, the collector can illuminate a plane.

36. A system, comprising:
the collector of claim 20,
wherein the system is an illumination system configured to be used with wavelengths in the EUV range, and the collector is configured so that, during use, the collector can illuminate a plane.

37. A system, comprising:
the collector of claim 27,
wherein the system is an illumination system configured to be used with wavelengths in the EUV range, and the collector is configured so that, during use, the collector can illuminate a plane.

38. A system, comprising:
an illumination system comprising the collector of claim 1, the illumination system being configured to be used with wavelengths in the EUV range, and the collector being configured so that, during use, the collector can illuminate a plane; and
a projection objective,
wherein the system is a projection exposure apparatus, the illumination system is configured so that, during use, the illumination system can illuminate a mask in the plane, and the projection objective is configured so that, during use, the projection objective can produce an image of the mask on a light sensitive substrate.

39. A system, comprising:
an illumination system comprising the collector of claim 20, the illumination system being configured to be used with wavelengths in the EUV range, and the collector being configured so that, during use, the collector can illuminate a plane; and
a projection objective,
wherein the system is a projection exposure apparatus, the illumination system is configured so that, during use, the illumination system can illuminate a mask in the plane, and the projection objective is configured so that, during use, the projection objective can produce an image of the mask on a light sensitive substrate.

40. A system, comprising:
an illumination system comprising the collector of claim 27, the illumination system being configured to be used with wavelengths in the EUV range, and the collector being configured so that, during use, the collector can illuminate a plane; and
a projection objective,
wherein the system is a projection exposure apparatus, the illumination system is configured so that, during use, the illumination system can illuminate a mask in the plane, and the projection objective is configured so that, during use, the projection objective can produce an image of the mask on a light sensitive substrate.

41. A method, comprising:
manufacturing microelectronic components using a system comprising:
an illumination system comprising the collector of claim 1, the illumination system being configured to be used with wavelengths in the EUV range, and the collector being configured so that, during use, the collector can illuminate a plane; and
a projection objective,
wherein the system is a projection exposure apparatus, the illumination system is configured so that, during use, the illumination system can illuminate a mask in the plane, and the projection objective is configured so that, during use, the projection objective can produce an image of the mask on a light sensitive substrate.

42. A method, comprising:
manufacturing microelectronic components using a system comprising:
an illumination system comprising the collector of claim 20, the illumination system being configured to be used with wavelengths in the EUV range, and the collector being configured so that, during use, the collector can illuminate a plane; and
a projection objective,
wherein the system is a projection exposure apparatus, the illumination system is configured so that, during use, the illumination system can illuminate a mask in the plane, and the projection objective is configured so that, during use, the projection objective can produce an image of the mask on a light sensitive substrate.

43. A method, comprising:
manufacturing microelectronic components using a system comprising:
an illumination system comprising the collector of claim 27, the illumination system being configured to be used with wavelengths in the EUV range, and the collector being configured so that, during use, the collector can illuminate a plane; and
a projection objective,
wherein the system is a projection exposure apparatus, the illumination system is configured so that, during use, the illumination system can illuminate a mask in the plane, and the projection objective is configured so that, during use, the projection objective can produce an image of the mask on a light sensitive substrate.

* * * * *

UNITED STATES PATENT AND TRADEMARK OFFICE
CERTIFICATE OF CORRECTION

| | | |
|---|---|---|
| PATENT NO. | : 7,910,900 B2 | |
| APPLICATION NO. | : 11/781010 | |
| DATED | : March 22, 2011 | |
| INVENTOR(S) | : Ralf Stuetzle | |

It is certified that error appears in the above-identified patent and that said Letters Patent is hereby corrected as shown below:

Column 4,
Line 57, Delete "in corporated" and insert --incorporated--

Column 8,
Line 29, Delete "lie" and insert --lay--

Column 9,
Line 25, Delete "times" and insert --20 times--

Column 21,
Line 48, Delete "11102" and insert --1102.--

Column 27,
Line 48, Delete "the" and insert --The--

Column 29,
Line 57, Delete "150mm" and insert --150 mm--

Signed and Sealed this
Tenth Day of May, 2011

David J. Kappos
*Director of the United States Patent and Trademark Office*